US011222932B2

(12) United States Patent
 Bok

(10) Patent No.: US 11,222,932 B2
(45) Date of Patent: Jan. 11, 2022

(54) ELECTRONIC DISPLAY APPARATUS INCLUDING A SOLAR CELL UNIT

(71) Applicant: SAMSUNG DISPLAY CO., LTD., Yongin-si (KR)

(72) Inventor: Seung-Iyong Bok, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/151,270

(22) Filed: Jan. 18, 2021

(65) Prior Publication Data

US 2021/0143233 A1   May 13, 2021

Related U.S. Application Data

(63) Continuation of application No. 16/435,068, filed on Jun. 7, 2019, now Pat. No. 10,923,539.

(30) Foreign Application Priority Data

Sep. 7, 2018 (KR) .......................... 10-2018-0107209

(51) Int. Cl.
 *G09G 3/3225* (2016.01)
 *H01L 27/32* (2006.01)
 *H01L 51/52* (2006.01)
 *H01L 31/048* (2014.01)

(52) U.S. Cl.
 CPC ....... *H01L 27/3227* (2013.01); *G09G 3/3225* (2013.01); *H01L 27/322* (2013.01); *H01L 31/048* (2013.01); *H01L 51/5203* (2013.01)

(58) Field of Classification Search
 CPC .. G09G 3/3225; H01L 31/048; H01L 51/5203
 See application file for complete search history.

(56) References Cited

U.S. PATENT DOCUMENTS

| 6,831,410 | B2* | 12/2004 | Huang ................ H01L 27/3248 |
| | | | 313/504 |
| 7,309,955 | B2 | 12/2007 | Kim |
| 8,907,324 | B2 | 12/2014 | Park et al. |
| 9,507,190 | B2 | 11/2016 | Lun |
| 9,698,311 | B2 | 7/2017 | Greco et al. |
| 2002/0116326 | A1 | 8/2002 | Sakamoto et al. |
| 2003/0146696 | A1* | 8/2003 | Park .................... H01L 27/3244 |
| | | | 313/506 |

(Continued)

FOREIGN PATENT DOCUMENTS

| KR | 10-0859657 | 9/2008 |
| KR | 10-2010-0099504 | 9/2010 |

(Continued)

*Primary Examiner* — Sejoon Ahn
(74) *Attorney, Agent, or Firm* — F. Chau & Associates, LLC

(57) ABSTRACT

An electronic display apparatus includes a light source unit configured to provide a first light. A color filter unit is disposed on the light source unit and is configured to receive the first light. The color filter unit includes a quantum dot. A first electrode layer is disposed on a first side of the color filter unit. A second electrode layer is disposed on a second side of the color filter unit. A solar cell unit is disposed on the light source unit and includes the first electrode layer, the color filter unit, and the second electrode layer.

20 Claims, 15 Drawing Sheets

(56) References Cited

U.S. PATENT DOCUMENTS

| | | | |
|---|---|---|---|
| 2003/0227253 | A1 | 12/2003 | Seo et al. |
| 2005/0007014 | A1 | 1/2005 | Kurata |
| 2005/0089772 | A1 | 4/2005 | Kawaguchi et al. |
| 2007/0007885 | A1 | 1/2007 | Feng et al. |
| 2007/0216622 | A1 | 9/2007 | Kim et al. |
| 2007/0275624 | A1 | 11/2007 | Kawaguchi et al. |
| 2008/0290796 | A1 | 11/2008 | Chan et al. |
| 2009/0108757 | A1 | 4/2009 | Lee et al. |
| 2009/0224662 | A1 | 9/2009 | Wu |
| 2010/0007632 | A1 | 1/2010 | Yamazaki |
| 2010/0245731 | A1 | 9/2010 | Umketkai et al. |
| 2011/0264037 | A1 | 10/2011 | Arasawa |
| 2011/0317121 | A1 | 12/2011 | Lin et al. |
| 2012/0181522 | A1 | 7/2012 | Yamazaki et al. |
| 2014/0129082 | A1 | 5/2014 | Takahashi et al. |
| 2015/0277004 | A1 | 10/2015 | Suzuki |
| 2015/0318508 | A1 | 11/2015 | Zhou et al. |
| 2016/0013451 | A1 | 1/2016 | Cheng et al. |
| 2017/0117330 | A1 | 4/2017 | Jang et al. |
| 2017/0139082 | A1 | 5/2017 | Takai et al. |
| 2017/0288093 | A1 | 10/2017 | Cha et al. |
| 2017/0352772 | A1 | 12/2017 | Eaglesham et al. |
| 2018/0045886 | A1 | 2/2018 | Chae et al. |
| 2020/0083303 | A1 | 3/2020 | Bok |

FOREIGN PATENT DOCUMENTS

| | | |
|---|---|---|
| KR | 10-1036356 | 5/2011 |
| KR | 10-2018-0024097 | 3/2018 |

\* cited by examiner

ELECTRONIC DISPLAY APPARATUS INCLUDING A SOLAR CELL UNIT

CROSS-REFERENCE TO RELATED APPLICATIONS

This U.S. non-provisional patent application is a Continuation of co-pending U.S. patent application Ser. No. 16/435,068, filed on Jun. 7, 2019, which claims priority under 35 U.S.C. § 119 to Korean Patent Application No. 10-2018-0107209, filed on Sep. 7, 2018, the entire contents of which are hereby incorporated by reference.

TECHNICAL FIELD

The present disclosure relates to an electronic display apparatus, and more particularly, to an electronic display apparatus having a solar cell unit.

DISCUSSION OF THE RELATED ART

Various electronic display apparatuses for providing image information, such as display devices, are used in multimedia devices such as a televisions, mobile phones, tablet computers, navigation systems, game machines, etc. For example, in liquid crystal display devices and display devices that utilize electroluminescence, quantum dots and the like have been used to provide better color reproduction.

Display elements for portable devices, such as notebook computers, smartphones, handheld game consoles, etc. may include an organic electroluminescence display element, which is a light-producing element that utilizes electricity. As portable devices generally rely on electricity that has been stored in a battery as means for supplying power, display elements are often responsible for using a high proportion of the available battery charge.

SUMMARY

An electronic display apparatus includes a light source unit configured to provide a first light. A color filter unit is disposed on the light source unit and is configured to receive the first light. The color filter unit includes a quantum dot. A first electrode layer is disposed on a first side of the color filter unit. A second electrode layer is disposed on a second side of the color filter unit. A solar cell unit is disposed on the light source unit and includes the first electrode layer, the color filter unit, and the second electrode layer.

An electronic display apparatus includes an organic light emitting display panel having a first base substrate, a circuit element layer having a pixel driving circuit, a display element layer disposed on the circuit element layer and including organic light emitting elements configured to provide light, and an encapsulation layer covering the display element layer. A second base substrate faces the first base substrate. A color filter unit is disposed between the second base substrate and the organic light emitting display panel and is configured to receive the provided light and including a quantum dot. A first electrode layer is disposed on a first side of the color filter unit. A second electrode layer is disposed on a second side of the color filter unit. An input sensing unit is disposed on the second base substrate and is configured to sense input from an outside source. A window panel covers the input sensing unit. A solar cell unit is defined by the first electrode layer, the color filter unit, and the second electrode layer and the solar cell unit is disposed on the organic light emitting display panel.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
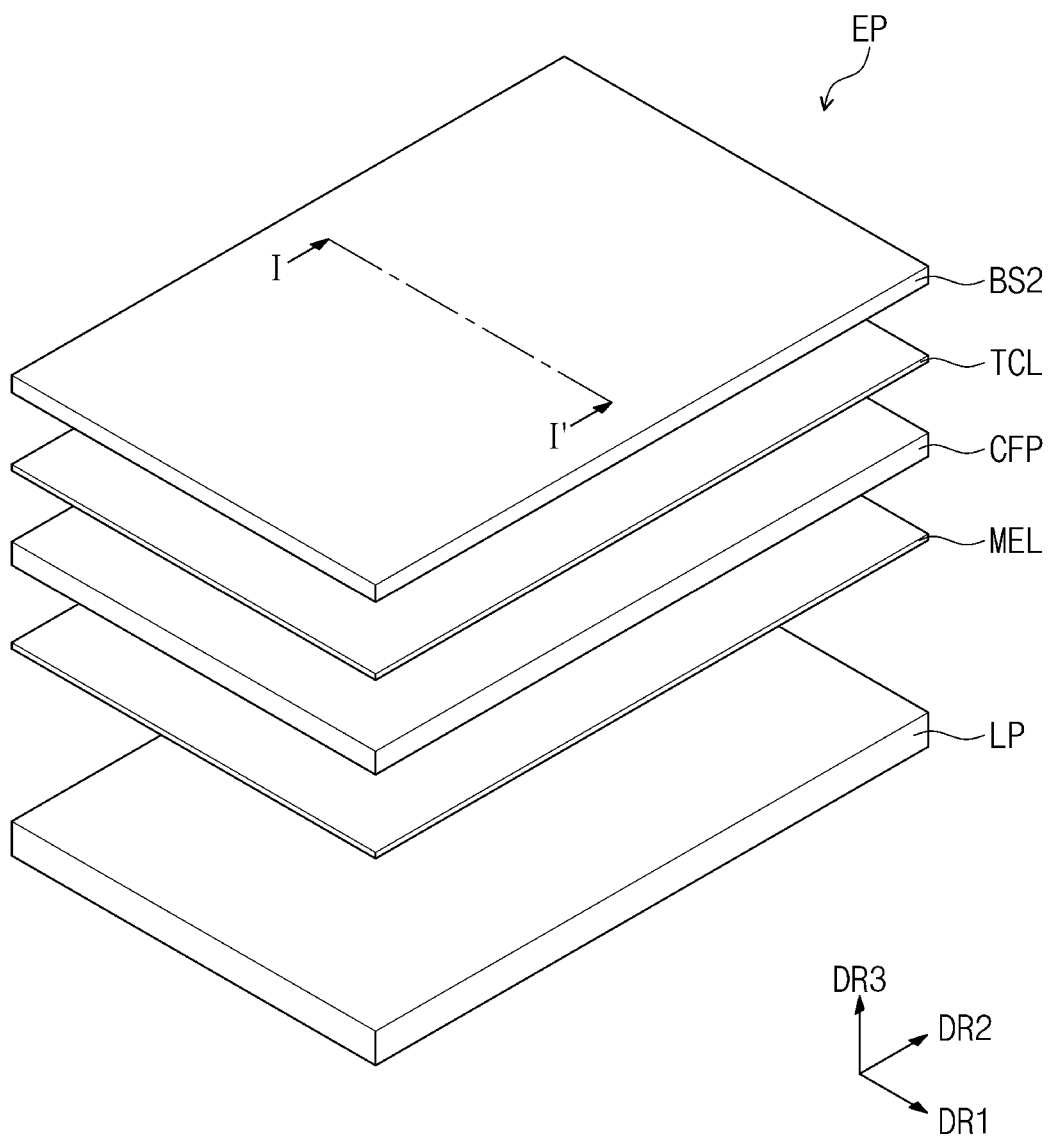
FIG. 1 is a perspective view illustrating an electronic panel included in an electronic display apparatus according to an exemplary embodiment of the present inventive concept.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

In the present disclosure, when an element (or a region, a layer, a portion, etc.) is referred to as being "on," "connected to," or "coupled to" another element, it means that the element may be disposed directly on/connected to/coupled to the other element, or that a third element may be disposed therebetween.

Like reference numerals may refer to like elements throughout the various figures and the corresponding detailed disclosure. Also, in the drawings, the thickness, the ratio, and the dimensions of elements may be exaggerated for an effective description of technical contents.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. The terms of a singular form may include plural forms unless the context clearly indicates otherwise.

In addition, terms such as "below," "lower," "above," "upper," and the like are used to describe the relationship of the configurations shown in the drawings. The terms are used as a relative concept and are described with reference to the direction indicated in the drawings.

Hereinafter, the inventive concept will be described with reference to the accompanying drawings.

Figure 2:
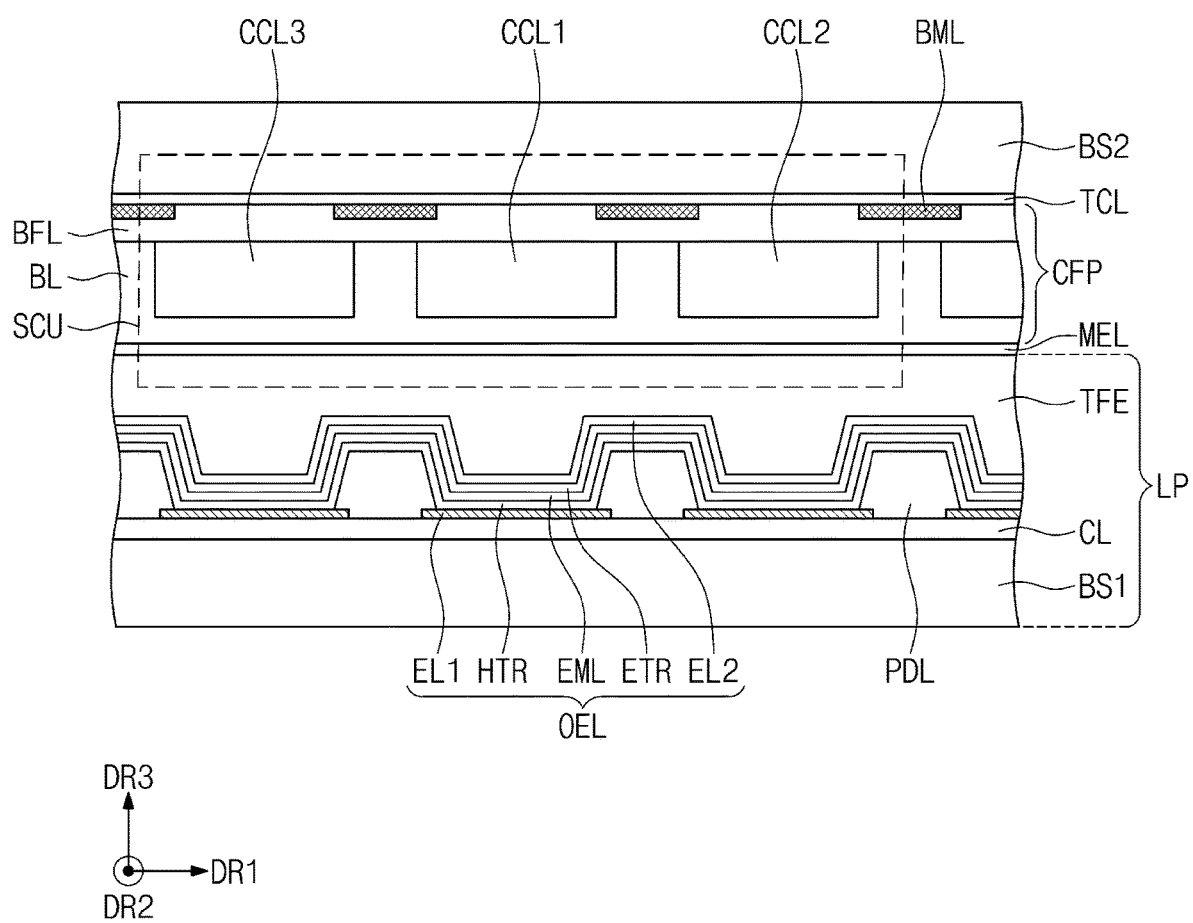
FIG. 2 is a cross-sectional view illustrating a portion of an electronic panel corresponding to line I-I' of FIG. 1 according to an exemplary embodiment of the present inventive concept.
Figure 3:
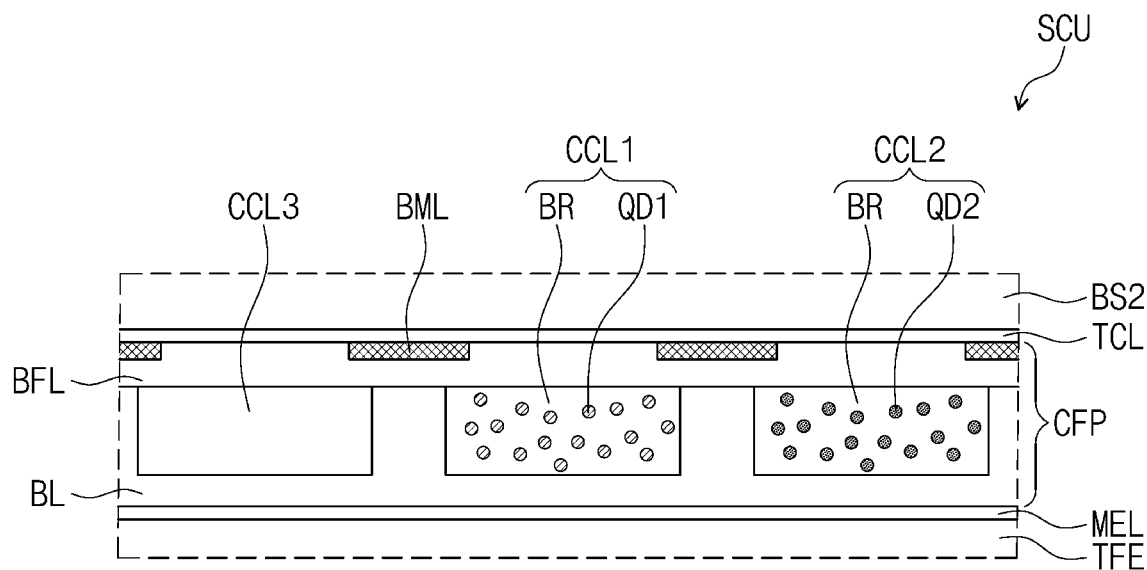
FIG. 3 is a cross-sectional view illustrating the solar cell unit illustrated in FIG. 2 according to an exemplary embodiment of the present inventive concept.

FIG. 1 is a perspective view illustrating an electronic panel included in an electronic display apparatus according to an exemplary embodiment of the present inventive concept. FIG. 2 is a cross-sectional view illustrating a portion corresponding to line I-I' of FIG. 1. FIG. 3 is a cross-sectional view illustrating region SCU of FIG. 2.

Referring to FIG. 1 and FIG. 2, an electronic panel EP, according to an exemplary embodiment of the present inventive concept, includes a light source unit LP, a color filter unit CFP disposed on the light source unit LP, a first electrode layer TCL disposed on a first side of the color filter unit CFP, and a second electrode layer MEL disposed on a second side of the color filter unit CFP. Here, a solar cell unit SCU is defined by the first electrode layer TCL, the color filter unit CFP, and the second electrode layer MEL, and the solar cell unit SCU may be disposed on the light source unit LP.

The electronic panel EP may include an organic light emitting display panel as the light source unit LP. Hereinafter, the light source unit LP is referred to as the organic light emitting display panel.

The organic light emitting display panel LP may include a first base substrate BS1, a circuit element layer CL, a display element layer OEL, and an encapsulation layer TFE.

The first base substrate BS1 may provide a base surface on which the circuit element layer CL and the display element layer OEL are disposed. The first base substrate BS1 may be a glass substrate, a metal substrate, a plastic substrate, or the like. However, the present inventive concept is not limited thereto, and the first base substrate BS1 may be an inorganic layer, an organic layer, and/or a composite material layer.

The circuit element layer CL is disposed on the first base substrate BS1, and the circuit element layer CL may include a plurality of transistors. For example, the circuit element layer CL may include a switching transistor and a driving transistor for driving an organic light emitting element.

The display element layer OEL may be disposed on the circuit element layer CL. As an example of the inventive concept, the display element layer OEL may include an organic light emitting element. Hereinafter, the display element layer OEL is referred to as the organic light emitting element. The organic light emitting element OEL may include a first electrode EL1 and a second electrode EL2, which face each other, and a plurality of organic layers disposed between the first electrode EL1 and the second electrode EL2. The organic light emitting element OEL may further include a hole transport region HTR, a light emitting layer EML, and an electron transport region ETR disposed between the first electrode EL1 and the second electrode EL2.

The organic light emitting element OEL emits a first light. For example, the organic light emitting element OEL may emit blue light as the first light.

As illustrated in FIG. 2, in the electronic panel EP, the light emitting layer EML of the organic light emitting element OEL may be a common layer on the first base substrate BS1. However, the inventive concept is not limited thereto. The light emitting layer EML may be patterned. For example, the light emitting layer EML may be patterned to be formed in a region partitioned by a pixel defining layer PDL. Alternatively, the light emitting layer EML may be patterned to correspond to each of first to third color conversion layers CCL1, CCL2, and CCL3, as is described in more detail below.

The encapsulation layer TFE may be disposed in the organic light emitting element OEL. For example, the encapsulation layer TFE is disposed on the second electrode EL2. The encapsulation layer TFE may be disposed directly on the second electrode EL2. The encapsulation layer TFE may be a single layer, or a laminate of a plurality of layers. The encapsulation layer TFE may be a thin film sealing layer. The encapsulation layer TFE covers the organic light emitting element OEL and protects the organic light emitting element OEL. The encapsulation layer TFE may cover the organic light emitting element OEL. The organic light emitting element OEL may be sealed by the encapsulation layer TFE.

The encapsulation layer TFE may include at least one organic film and at least one inorganic film. The at least one inorganic film and the at least one organic film may be alternately and repeatedly disposed. For example, the encapsulation layer TFE may include an organic film disposed between two inorganic films and two inorganic films. In the present embodiment, an inorganic film may include an inorganic material such as aluminum oxide and silicon nitride, and an organic film may include an acrylate-based organic material.

The color filter unit CFP may be disposed on the organic light emitting display panel LP. The color filter unit CFP may include a plurality of color conversion layers CCL1, CCL2, and CCL3 which are spaced apart from each other on a plane.

A second base substrate BS2 may provide a base surface on which the color filter unit CFP is disposed. The second base substrate BS2 may be a glass substrate, a metal substrate, a plastic substrate, and the like. However, the inventive concept is not limited thereto, and the second base substrate BS2 may be an inorganic layer, an organic layer, or a composite material layer.

The color filter unit CFP may further include a light shielding layer BML disposed within a layer of the color conversion layers CCL1, CCL2, and CCL3. In the electronic panel DP, according to the present embodiment, the light shielding layer BML may be disposed at a position corresponding to the pixel defining layer PDL.

Referring to FIG. 2, in a first direction DR1, the first to third color conversion layers CCL1, CCL2, and CCL3, which emit light of different colors, are disposed side by side while being spaced apart from each other. In a second direction DR2, color conversion layers which emit light of the same color may be disposed side by side while being spaced apart from each other. The light shielding layer BML is disposed among the color conversion layers CCL1, CCL2, and CCL3 disposed spaced apart from each other, and the light shielding layer BML may be a black matrix. The light shielding layer BML may include an organic light shielding material or an inorganic light shielding material, both of which may include a black pigment or a black dye. The light shielding layer BML may be configured to prevent light leakage and delineate the boundaries among the adjacent color conversion layers CCL1, CCL2, and CCL3. At least a portion of the light shielding layer BML may overlap the adjacent color conversion layers CCL1, CCL2, and CCL3.

Referring to FIG. 3, the color filter unit CFP may include converters QD1 and QD2 which are configured to convert the first light into desired wavelengths. As an example of the inventive concept, the color filter unit CFP may include a first converter QD1 which absorbs the first light and converts the wavelength of the first light into a second light and a second converter QD2 which absorbs the first light and converts the wavelength of the first light into a third light. For example, the first light may be blue light, the second light may be green light, and the third light may be red light.

In the present embodiment, the first color conversion layer CCL1 may include the first converter QD1, and the second color conversion layer CCL2 may include the second converter QD2. For example, the first converter QD1 absorbs the first light, which is blue light, and emits green light as the second light. The second converter QD2 absorbs the first light, which is blue light, and emits red light as the third light. For example, the first color conversion layer CCL1 may provide a light emitting region which emits the green light, and the second color conversion layer CCL2 may provide a light emitting region which emits the red light.

The first converter QD1 may be a green quantum dot that is excited by blue light, which is the first light, to emit green light, which is the second light. The second converter QD2 may be a red quantum dot that is excited by blue light, which is the first light, or by green light, which is the second light, to emit red light.

A quantum dot may be a particle which is configured to convert a wavelength of the first light provided from the organic light emitting display panel LP. A quantum dot is a material having a crystal structure of a few nanometers in size, and is composed of hundreds to thousands of atoms. Due to a small size thereof, a quantum dot exhibits a quantum confinement effect in which an energy band gap is increased. When light of a wavelength having a greater energy than that of the band gap is incident on a quantum dot, the quantum dot may move to an excited state by absorbing the light and may then relax back to a ground state while emitting light having a specific wavelength. The emitted light has a value corresponding to the band gap. When the quantum dot is adjusted in size and composition, a light emitting characteristic due to the quantum confinement effect may be adjusted. Depending on the particle size of a quantum dot, the color of emitted light may be changed. The smaller the particle size of a quantum dot, the shorter the wavelength of light that may be emitted. For example, the particle size of a quantum dot emitting green light may be smaller than the particle size of a quantum dot emitting red light.

A quantum dot may be selected from a Group II-VI compound, a Group III-V compound, a Group IV-VI compound, a Group IV element, a Group IV compound, and/or a combination thereof.

The Group II-VI compound may be selected from the group consisting of a binary compound of CdSe, CdTe, ZnS, ZnSe, ZnTe, ZnO, HgS, HgSe, HgTe, MgSe or MgS, a ternary compound of AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe or MgZnS, and a quaternary compound of HgZnTeS, CdZnSeS, CdZnSeTe, CdZnSTe, CdHgSeS, CdHgSeTe, CdHgSTe, HgZnSeS, HgZnSeTe or HgZnSTe, and a mixture thereof.

The Group III-V compound may be selected from the group consisting of a binary compound of GaN, GaP, GaAs, GaSb, AlN, AP, AlAs, AlSb, InN, InP, InAs or InSb, a ternary compound of GaNP, GaNAs, GaNSb, GaPAs, GaPSb, AlNP, AlNAs, AlNSb, AlPAs, AlPSb, InGaP InNP, InNAs, InNSb, InPAs, InPSb or GaAlNP, and a quaternary compound of GaAlNAs, GaAlNSb, GaAlPAs, GaAlPSb, GaInNP, GaInNAs, GaInNSb, GanPAs, GaInPSb, InAlNP, InAlNAs, InAlNSb, InAlPAs or InAlPSb, and a mixture thereof. The Group IV-VI compound may be selected from the group consisting of a binary compound of SnS, SnSe, SnTe, PbS, PbSe, PbTe, and a mixture thereof, a ternary compound of SnSeS, SnSeTe, SnSTe, PbSeS, PbSeTe, PbSTe, SnPbS, SnPbSe, SnPbTe, and a mixture thereof, and a quaternary compound of SnPbSSe, SnPbSeTe, SnPbSTe, and a mixture thereof. The Group IV element may be selected from the group consisting of Si, Ge, and a mixture thereof. The IV group compound may be a binary compound of SiC, SiGe, and a mixture thereof.

At this time, a binary compound, a ternary compound, or a quaternary compound may be present in a particle with a uniform concentration distribution, or may be present in the same particle with a partially different concentration distribution.

A quantum dot may have a core-shell structure in which a core and a shell surrounding the core are included. In addition, a quantum dot may have a core-shell structure in which one quantum dot surrounds another quantum dot. An interface between a core and a shell may have a concentration gradient in which the concentration of an element present in the shell becomes lower toward the center.

A quantum dot may be a particle having a size of several nanometers. A quantum dot may have a full width of half maximum (FWHM) of a light emission wavelength spectrum of about 45 nm or less, preferably about 40 nm or less, more preferably about 30 nm or less, and color purity or color reproducibility may be increased in the above range. In addition, light emitted through such a quantum dot is emitted in all directions so that a viewing angle may be widened.

In addition, although the form of a quantum dot is not particularly limited, for example, a quantum dot in the form of spherical, pyramidal, multi-arm, or cubic nanoparticles, nanotubes, nanowires, nanofibers, nanoparticles, and the like may be used.

A quantum dot may include a nanoparticle oxide in which an oxide is coated on a porous particle composed of a nanoparticle. A nanoparticle oxide may include titanium dioxide ($TiO_2$). A dye polymer may be adsorbed to a nanoparticle oxide. In the present embodiment, both the first and second electrode layers TCL and MEL may be made of a transparent conductive material. However, in order to increase energy efficiency, the second electrode layer MEL may be made of platinum which has high reflectivity. When external light is incident thereon, a photon is first absorbed by a dye polymer. A dye is excited by external light absorption, and electrons are sent to a conduction band of a nanoparticle oxide.

When a quantum dot includes a nanoparticle oxide, the color filter unit CFP may further include an electrolyte solution layer to cause an oxidation reaction with the electrons between the first electrode layer TCL and at least one of the color conversion layers CCL1, CCL2, and CCL3.

Each of the first and second color conversion layers CCL1 and CCL2 may further include a base resin BR. The base resin BR is a medium in which the first and second converters QD1 and QD2 are dispersed, and may be made of various resin compositions which may be generally referred to as a binder. However, the exemplary embodiment of the inventive concept is not limited thereto. In the present specification, any medium capable of dispersing and disposing the first and second converters QD1 and QD2 may be referred to as the base resin BR regardless of the name, additional functions, constituent materials, and the like thereof. The base resin BR may be a polymer resin. For example, the base resin BR may be an acrylic-based resin, a urethane-based resin, a silicone-based resin, an epoxy-based resin, and the like. The base resin BR may be a transparent resin.

The third color conversion layer CCL3 may be a portion which does not include a converting body. The third color conversion layer CCL3 may be a portion which transmits the first color light provided from the organic light emitting display panel LP. For example, the third color conversion layer CCL3 may be a region which transmits blue light. The third color conversion layer CCL3 may be formed of a polymer resin. For example, the third color conversion layer CCL3 may be an acrylic-based resin, a urethane-based resin, a silicone-based resin, an epoxy-based resin, and the like. The third color conversion layer CCL3 may be formed of a transparent resin, or a white resin.

The first to third color conversion layers CCL1, CCL2, and CCL3 may be disposed on a lower surface of the second base substrate BS2. The first to third color conversion layers CCL1, CCL2, and CCL3 may be patterned and disposed on the lower surface of the second base substrate BS2.

According to an exemplary embodiment of the present inventive concept, each of the first to third color conversion layers CCL1, CCL2, and CCL3 may further include a scatterer. The scatterer may include a scattering particle which scatters light incident on a corresponding color conversion layer.

The scattering particle may be dispersed in the base resin BR together with the first and second converters QD1 and QD2 to be formed in the first and second color conversion layers CCL1 and CCL2. The scattering particle may be dispersed in a polymer resin to be formed in the third color conversion layer CCL3. As an example of the inventive concept, the scattering body may include titanium dioxide ($TiO_2$).

Referring to FIG. 2 and FIG. 3, the first electrode layer TCL is disposed between the second base substrate BS2 and the color filter unit CFP. The first electrode layer TCL may include a transparent conductive material. For example, the first electrode layer TCL may include any one material of indium tin oxide (ITO) or tin oxide (TO). The first electrode layer TCL may be disposed on the lower surface of the second base substrate BS2 by using a sputtering method or a CVD method.

The color filter unit CFP may further include a buffer layer BFL interposed between the first to third color conversion layers CCL1, CCL2, and CCL3 and the first electrode layer TCL. As an example of the inventive concept, the buffer layer BFL may include cadmium sulfide (CdS). The buffer layer BFL may be formed by using a vacuum deposition method, a sputtering method, a chemical vapor deposition (CVD) method, and/or a pyrolysis method.

The buffer layer BFL ensures an interface reaction between the first and second color conversion layers CCL1 and CCL2 and the first electrode layer TCL, and increasing photoelectric conversion efficiency of the solar cell unit SCU. The buffer layer BFL functions to move electrons among carriers generated in the first and second color conversion layers CCL1 and CCL2 by external light to the first electrode layer TCL. The buffer layer BFL is not limited to cadmium sulfide (CdS), and may be any n-type material capable of functioning to move the electrons generated in the first and second color conversion layers CCL1 and CCL2 to the first electrode layer TCL.

The color filter unit CFP may further include a barrier layer BL configured to cover the first to third color conversion layers CCL1 to CCL3. The barrier layer BL is disposed on at least one of an upper portion and a lower portion of the first to third color conversion layers CCL1 to CCL3 to prevent the first to third color conversion layers CCL1 to CCL3 from being exposed to moisture/oxygen.

The barrier layer BL may include at least one inorganic layer. For example, the barrier layer BL may include an inorganic material. For example, the barrier layer BL may include silicon nitride, aluminum nitride, zirconium nitride, titanium nitride, hafnium nitride, tantalum nitride, silicon oxide, aluminum oxide, titanium oxide, tin oxide, cerium oxide and/or silicon oxynitride, or a metal thin film having light transmittance secured, and the like. The barrier layer BL may further include an organic film. The barrier layer BL may be composed of a single layer or a plurality of layers.

The second electrode layer MEL may be further disposed between the color filter unit CFP and the organic light emitting display panel LP. When the barrier layer BL is disposed between the color filter unit CFP and the organic light emitting display panel LP, the second electrode layer MEL may be disposed between the barrier layer BL and the organic light emitting display panel LP. For example, the second electrode layer MEL may be disposed between the encapsulation layer TFE of the organic light emitting display panel DP and the barrier layer BL.

The second electrode layer MEL may be formed of a transparent conductive material such as ITO. In addition, the second electrode layer MEL may be formed of a metal material such as Ag/Mg, but may have high transparency by adjusting the thickness thereof.

The first and second color conversion layers CCL1 and CCL2, which respectively include the first and second converters QD1 and QD2, absorb external light to generate carriers (electrons and holes), and the holes among the carriers move to the second electrode layer MEL. At the interface of the buffer layer BFL and the first and second color conversion layers CCL1 and CCL2, the carriers are separated so that the electrons move to the first electrode layer TCL through the buffer layer BFL and the holes move to the second electrode layer MEL. Here, the first and second converters QD1 and QD2 may be formed of a p-type quantum dot, and the buffer layer BFL may be formed on an n-type material.

When external light is incident on the first and second converters QD1 and QD2 in the state in which the solar cell unit SCU is turned on by allowing first and second driving signals to be respectively supplied to the first and second electrode layers TCL and MEL, the first and second converters QD1 and QD2 cause photoelectric conversion to accumulate electrical energy. The electrical energy accumulated by the solar cell unit SCU may be used as electrical power required to drive an electronic display apparatus.

Here, the case in which the solar cell unit SCU receives external light incident through the second base substrate BS2, and converts the received external light into electrical energy is illustrated. However, the exemplary embodiment of the inventive concept is not limited thereto. For example, the solar cell unit SCU may convert not only external light but also light output from the organic light emitting display panel LP (hereinafter, referred to as internal light) into electrical energy, and may accumulate the converted energy. An exemplary embodiment using the internal light will be described in detail with reference to FIG. 8.

Figure 4:
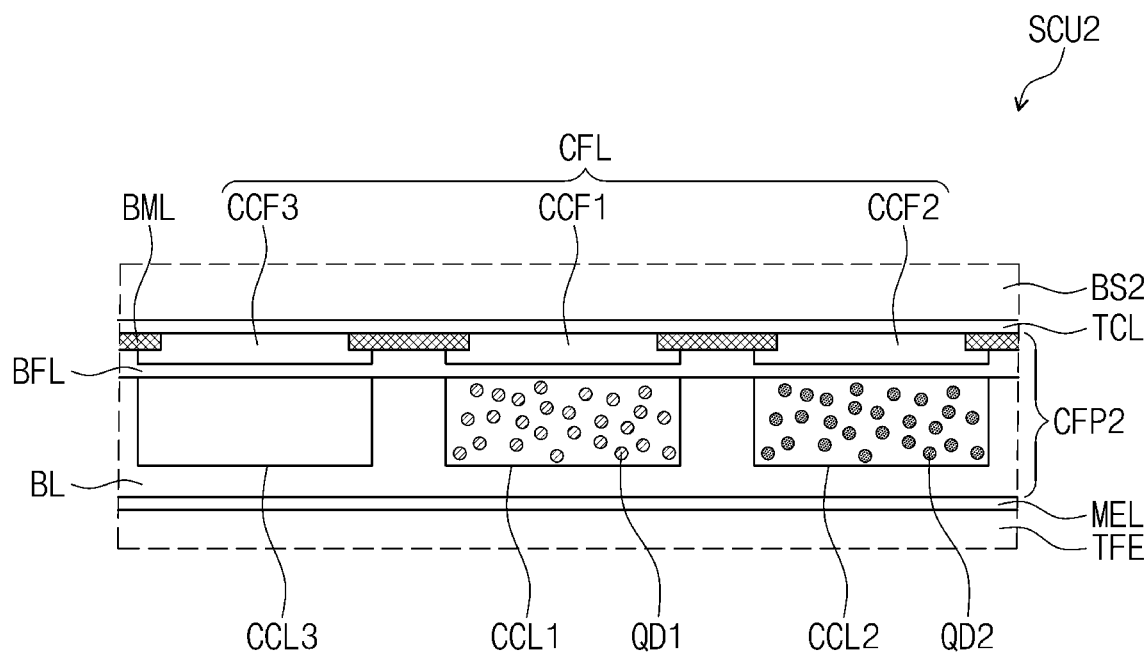
FIG. 4 is a cross-sectional view illustrating a solar cell unit according to an exemplary embodiment of the present inventive concept.

FIG. 4 is a cross-sectional view illustrating a solar cell unit according to an exemplary embodiment of the present inventive concept.

Referring to FIG. 4, in a solar cell unit SCU2, according to an exemplary embodiment of the present inventive concept, a color filter unit CFP2 may further include a color filter layer CFL disposed between the plurality of color conversion layers CCL1, CCL2, and CCL3 and the first electrode layer TCL.

The color filter layer CFL includes a first color filter CCF1 overlapping the first color conversion layer CCL1, a second color filter CCF2 overlapping the second color conversion layer CCL2, and a third color filter CCF3 overlapping the third color conversion layer CCL3.

The color filter layer CFL may prevent reflection caused by external light. In the color filter layer CFL, the first color filter CCF1 may be a green filter, the second color filter CCF2 may be a red filter, and the third color filter CCF3 may be a blue filter. The first color filter CCF1 transmits light provided from the first color conversion layer CCL1, the second color filter CCF2 transmit light provided from the second color conversion layer CCL2, and the third color filter CCF3 transmits light provided from the third color conversion layer CCL3. For example, each of the first to third color filters CCF1, CCF2, and CCF3 may block light other than light provided from a corresponding color conversion layer.

As illustrated in FIG. 4, the color filter unit CFP2 may further include the buffer layer BFL and the barrier layer BL respectively disposed on the upper portion and the lower portion of the color conversion layers CCL1, CCL2, and CCL3.

The buffer layer BFL may be disposed between the color filter layer CFL and the color conversion layers CCL1, CCL2, and CCL3, and the barrier layer BL may be disposed between the color conversion layers CCL1, CCL2, and CCL3 and the second electrode layer MEL. The same contents as those for the buffer layer BFL and the barrier layer BL both described with reference to FIG. 3 may be applied to the buffer layer BFL and the barrier layer BL of the FIG. 4.

Figure 5:
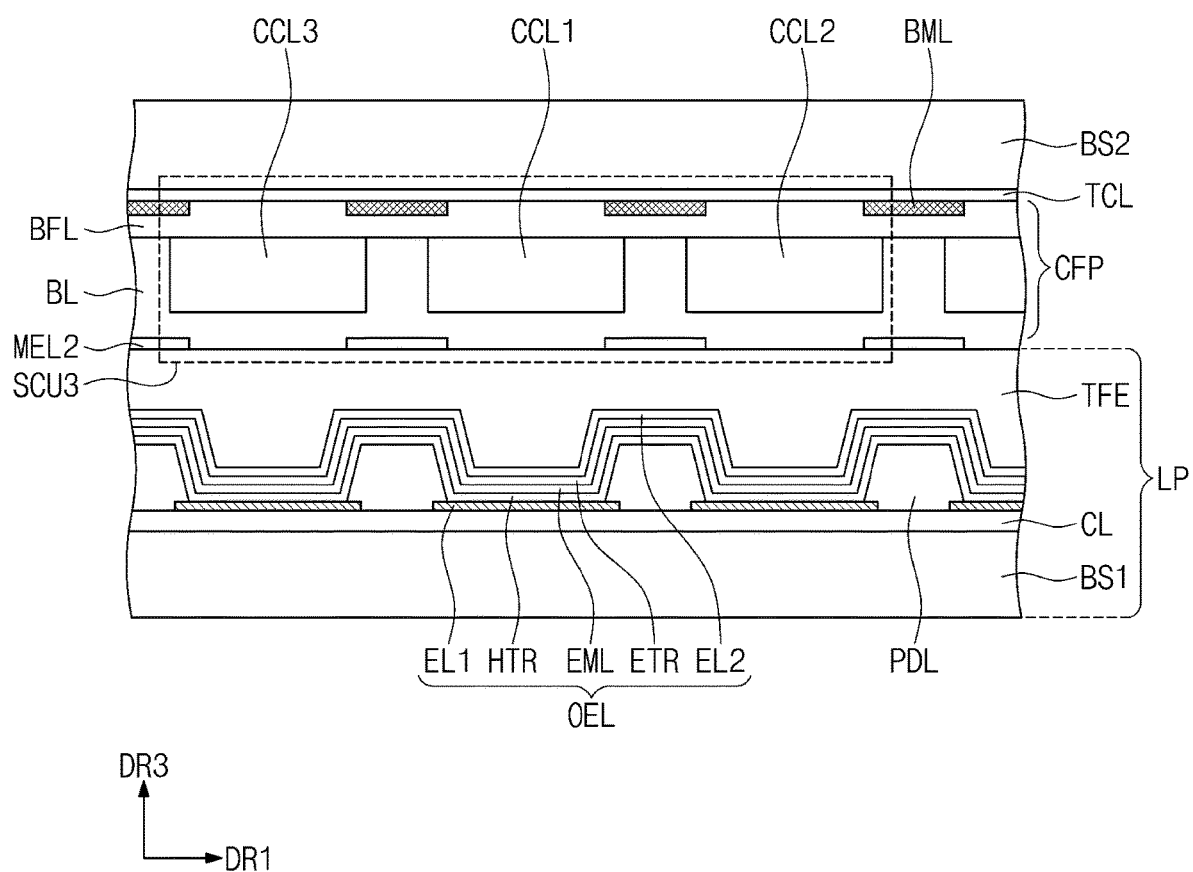
FIG. 5 is a cross-sectional view illustrating a solar cell unit according to an exemplary embodiment of the present inventive concept.

FIG. 5 is a cross-sectional view illustrating an electronic panel including a solar cell unit according to an exemplary embodiment of the present inventive concept.

Referring to FIG. 5, in a solar cell unit SCU3, according to an exemplary embodiment of the present inventive concept, a second electrode layer MEL2 disposed between the color filter unit CFP and the organic light emitting display panel LP has a patterned structure.

When the barrier layer BL is disposed on the color filter unit CFP, the second electrode layer MEL2 may be disposed between the barrier layer BL and the organic light emitting display panel LP. As an example of the inventive concept, the second electrode layer MEL2 may be formed through a process in which an electrode material is formed on the barrier layer BL and then patterned. Alternatively, the second electrode layer MEL2 may be formed through a process in which an electrode material is formed on the encapsulation layer TFE and then patterned. When the electrode material is formed on the barrier layer BL, the second electrode layer MEL2 may be formed by patterning the electrode material so as to remain at a position corresponding to the light shielding layer BML. In addition, when the electrode material is formed on the encapsulation layer TFE, the second electrode layer MEL2 may be formed by patterning the electrode material so as to remain at a position corresponding to the pixel defining layer PDL.

As such, when the second electrode layer MEL2 is disposed at the position corresponding to the light shielding layer BML, the second electrode layer MEL2 may include a metal material having a high work function. Alternatively, the second electrode layer MEL2 may include a material such as Au, Cu/Au, ZnTe, Te, Ni/Al, graphite, all of which are doped with copper (Cu), and Au, Cu/Au, ZnTe, Te, ZnTe; Cu, Ni/Al, all of which are doped with phosphorus (P).

Figure 6:
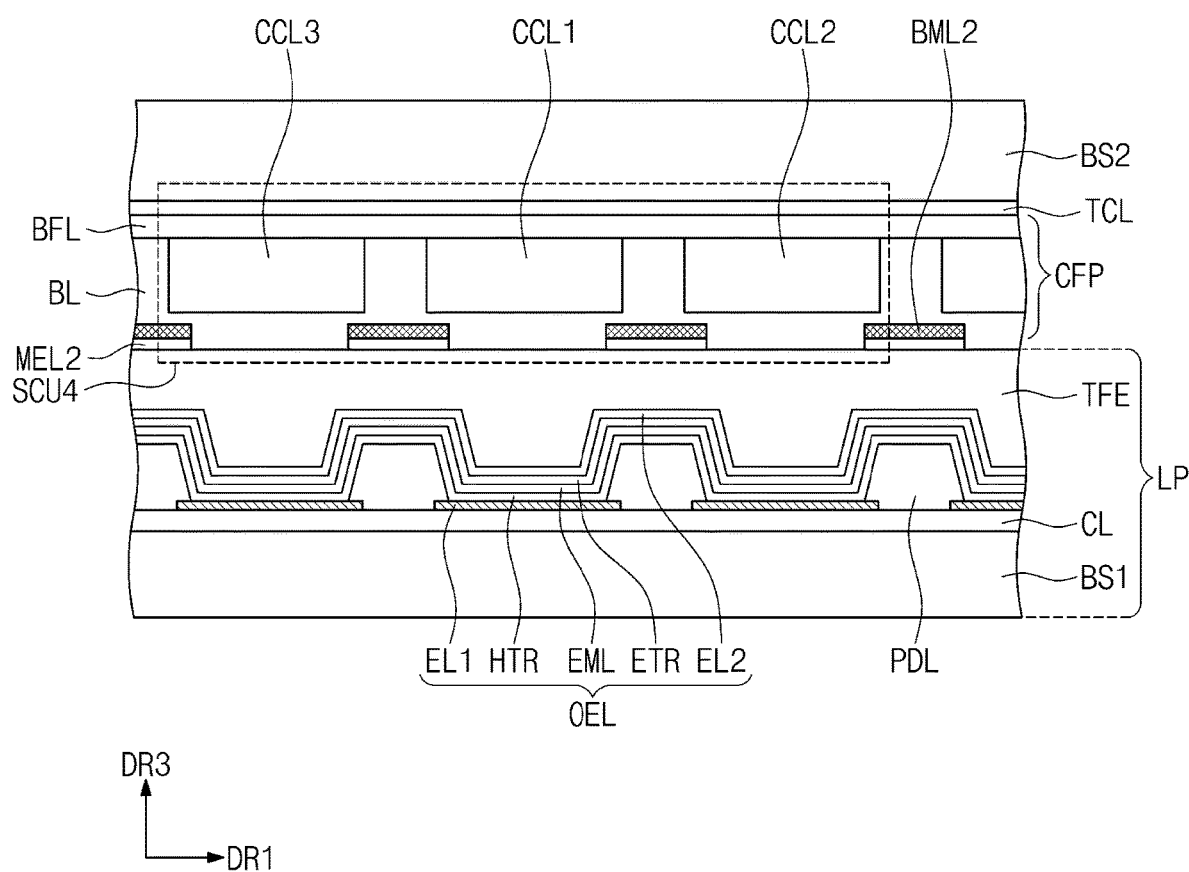
FIG. 6 is a cross-sectional view illustrating a solar cell unit according to an exemplary embodiment of the present inventive concept.

FIG. 6 is a cross-sectional view illustrating an electronic panel including a solar cell unit according to an exemplary embodiment of the present inventive concept.

Referring to FIG. 6, in a solar cell unit SCU4, according to an exemplary embodiment of the present inventive concept, the second electrode layer MEL2 disposed between the color filter unit CFP and the organic light emitting display panel LP has a patterned structure.

A light shielding layer BML2 may be disposed on the second electrode layer MEL2. The light shielding layer BML2 may be disposed directly on the second electrode layer MEL2. The light shielding layer BML2 may be a black matrix. The light shielding layer BML2 may include an organic light shielding material or an inorganic light shielding material both including a black pigment or a black dye. The light shielding layer BML2 may prevent light leakage and may delineate the boundaries among the adjacent color conversion layers CCL1, CCL2, and CCL3. At least a portion of the light shielding layer BML2 may overlap the neighboring color conversion layers CCL1, CCL2, and CCL3.

In FIG. 6, a structure in which the second electrode layer MEL2 is disposed between the light shielding layer BML2 and the encapsulation layer TFE is illustrated, but the inventive concept is not limited thereto. For example, the light shielding layer BML2 may be disposed between the second electrode layer MEL2 and the encapsulation layer TFE.

Figure 7:
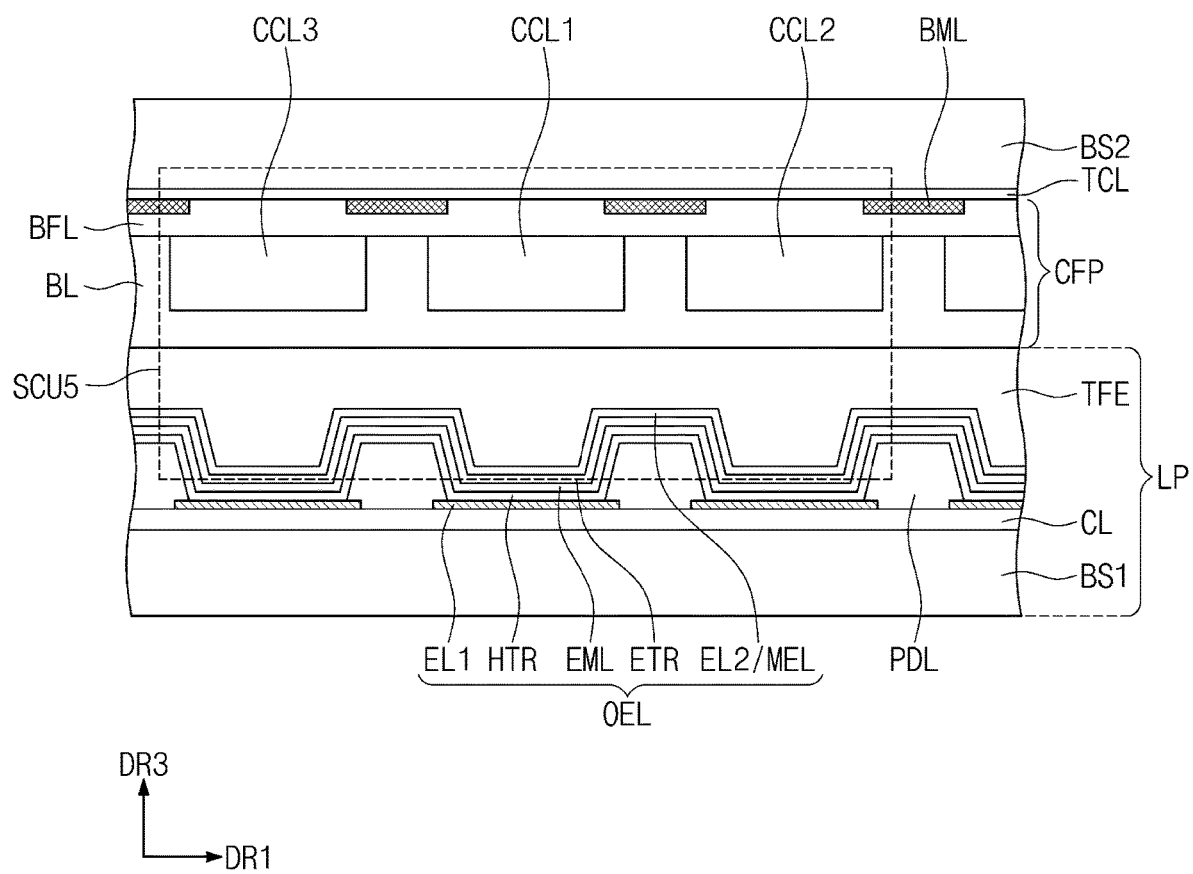
FIG. 7 is a cross-sectional view illustrating a solar cell unit according to an exemplary embodiment of the present inventive concept.

FIG. 7 is a cross-sectional view illustrating an electronic panel including a solar cell unit according to an exemplary embodiment of the present inventive concept.

Referring to FIG. 7, in a solar cell unit SCU5, according to an exemplary embodiment of the present inventive concept, the second electrode layer MEL may be disposed on the light emitting layer EML of the organic light emitting element OEL. For example, the second electrode EL2 of the organic light emitting element OEL may be used as the second electrode layer MEL of the solar cell unit SCU5.

When the second electrode EL2 of the organic light emitting element OEL is used as the second electrode layer MEL of the solar cell unit SCU5, since the second electrode layer MEL is not separately formed, the number of processes may be reduced.

In a display mode in which the organic light emitting element OEL operates, the second electrode EL2 does not serve as the second electrode layer MEL. For example, in the display mode, the solar cell unit SCU5 is turned off. In a standby mode in which the organic light emitting diode OEL does not operate, the second electrode EL2 may serve as the second electrode layer MEL. For example, the solar cell unit SCU5 may be turned on only in the standby mode. As such, when the solar cell unit SCU5 shares an electrode with the organic light emitting element OEL, the solar cell unit SCU5 and the organic light emitting element OEL cannot be simultaneously driven. The solar cell unit SCU5 may cause photoelectric conversion only in the standby mode in which the organic light emitting element OEL does not operate to accumulate electrical energy.

Figure 8:
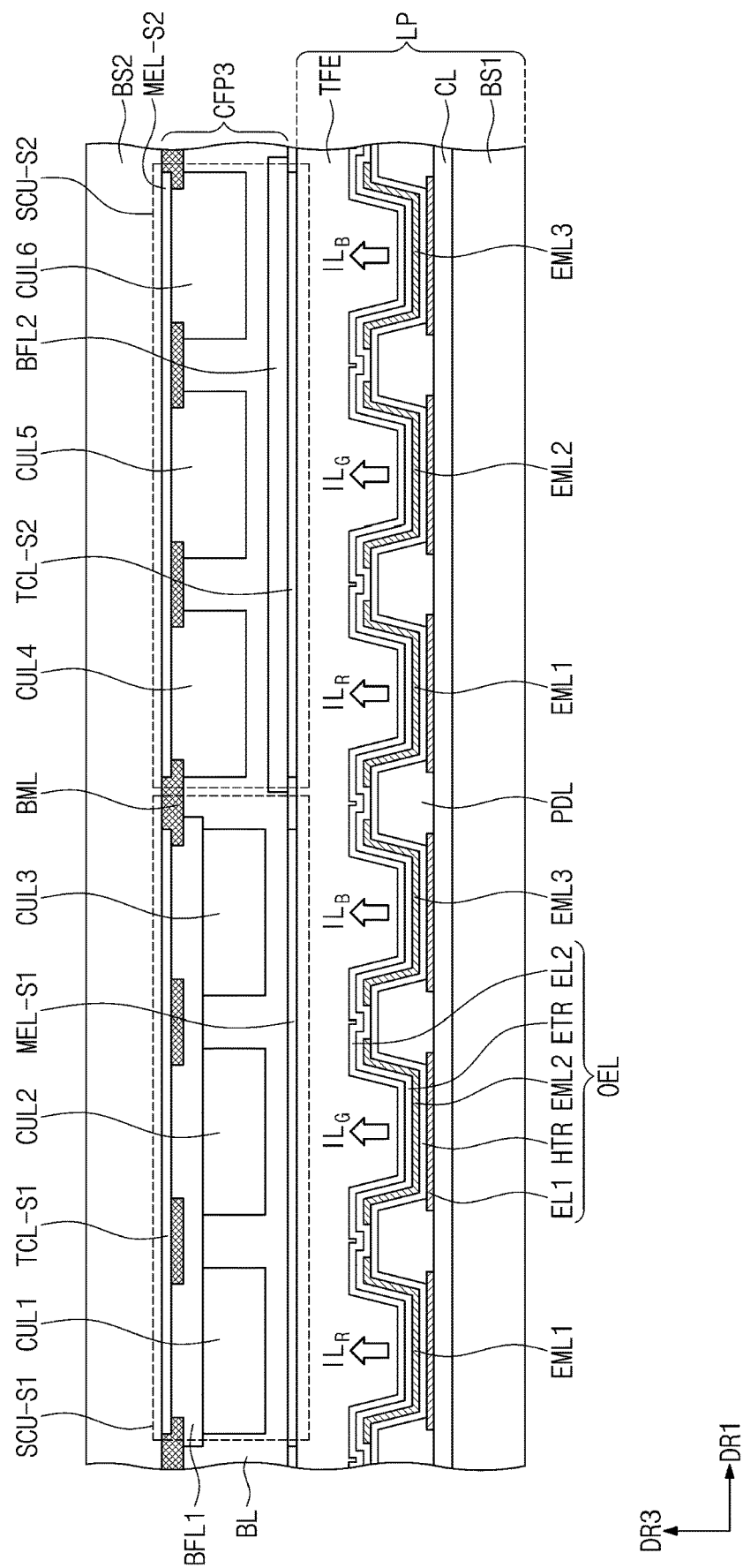
FIG. 8 is a cross-sectional view illustrating an exemplary embodiment of an electronic panel according to an exemplary embodiment of the present inventive concept.
Figure 9A:
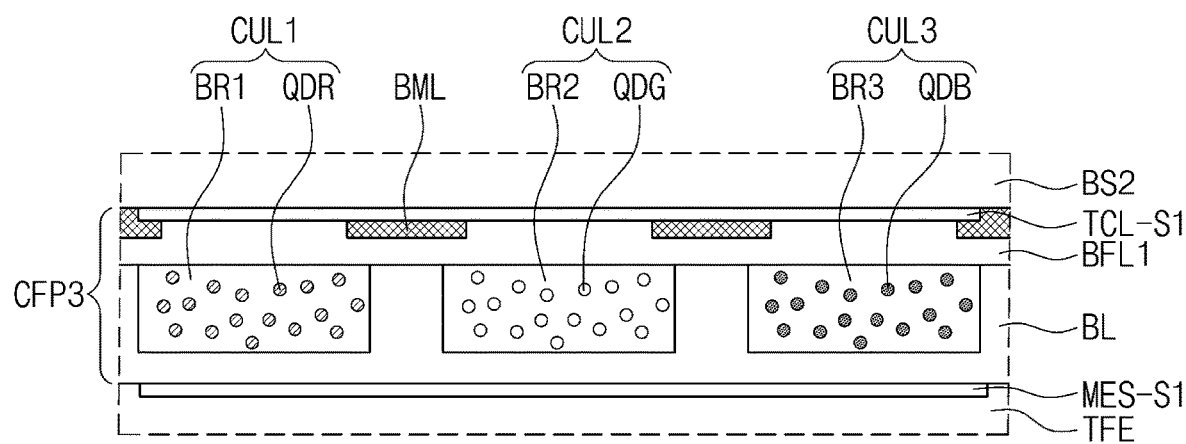
FIG. 9A is a cross-sectional view illustrating the first sub-solar cell unit illustrated in FIG. 8 according to an exemplary embodiment of the present inventive concept.
Figure 9B:
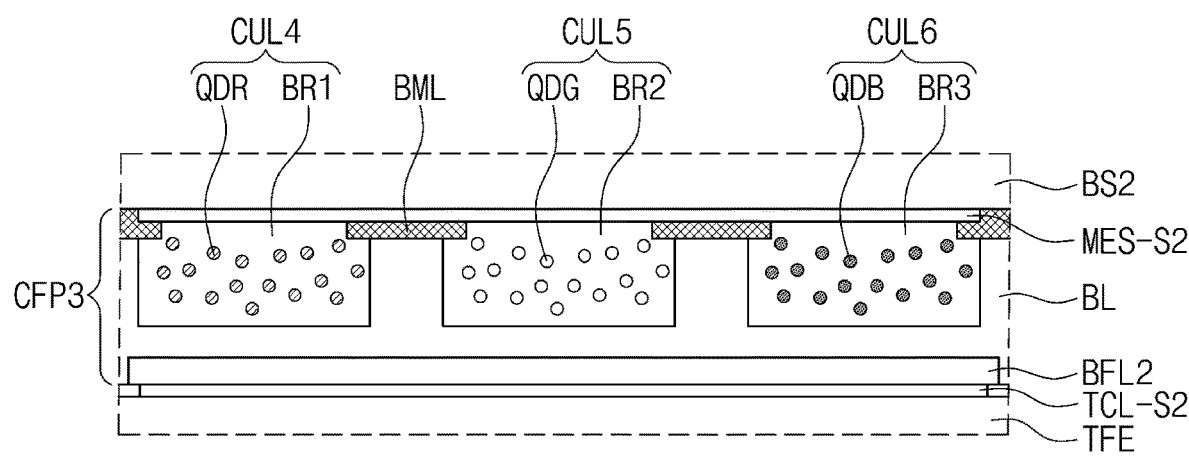
FIG. 9B is a cross-sectional view illustrating the second sub-solar cell unit illustrated in FIG. 8 according to an exemplary embodiment of the present inventive concept.

FIG. 8 is a cross-sectional view illustrating an electronic panel in accordance with exemplary embodiments of the present inventive concept. FIG. 9A is a cross-sectional view illustrating a first sub-solar cell unit illustrated in FIG. 8, and FIG. 9B is a cross-sectional view illustrating a second sub-solar cell unit illustrated in FIG. 8.

Referring to FIG. 8, an electronic panel, according to an exemplary embodiment of the present inventive concept, includes a color filter unit CFP3 interposed between the second base substrate BS2 and the organic light emitting display panel LP. The electronic panel further includes a first sub-electrode layer TCL-S1, a second sub-electrode layer MEL-S1, a third sub-electrode layer MEL-S2, and a fourth sub-electrode layer TCL-S2.

The first and third sub-electrode layers TCL-S1 and MEL-S2 are disposed on a first side of the color filter unit CFP3, and the second and fourth sub-electrode layers MEL-S and TCL-S2 are disposed on a second side of the color filter unit CFP3. Here, a first sub-solar cell unit SCU-S1 is defined by the first sub-electrode layer TCL-S1, the color filter unit CFP3, and the second sub-electrode layer MEL-S, and the second sub-solar cell unit SCU-S2 is defined by the third sub-electrode layer MEL-S2, the color filter unit CFP3, and the fourth sub-electrode layer TCL-S2. The first and second sub-solar cell units SCU-S1 and SCU-S2 may be disposed on the light source unit LP.

The color filter unit CFP3 may include first to third color unit layers CUL1 to CUL3 and fourth to sixth color unit layers CUL4 to CUL6.

As illustrated in FIG. 9A and FIG. 9B, each of the first and fourth color unit layers CUL1 and CUL4 includes a first base resin BR1 and a red quantum dot QDR disposed in the first base resin BR1. Each of the second and fifth color unit layers CUL2 and CUL5 includes a second base resin BR2 and a green quantum dot QDG disposed in the second base resin BR2. Each of the third and sixth color unit layers CUL3 and CUL6 includes a third base resin BR3 and a blue quantum dot QDB disposed in the third base resin BR3.

The same contents as those for the materials of the quantum dots of the embodiments described with reference to FIG. 3 may be applied to materials of the red, green, blue quantum dots QDR, QDG, and QDB of the FIG. 9A and FIG. 9B.

The first sub-electrode layer TCL-S1 is disposed on the lower surface of the second base substrate BS2. The same contents as those for the first electrode layer TCL of the embodiments described with reference to FIG. 3 and FIG. 4 may be applied to the first sub-electrode layer TC-S1 of the FIG. 9A and FIG. 9B.

The color filter unit CFP3 may further include a first buffer layer BFL1, a second buffer layer BFL2, and the barrier layer BL. The first sub-electrode layer TCL-S1 is covered by the first buffer layer BFL. The first buffer layer BFL1 is interposed between the first sub-electrode layer TCL-S and the first to third color unit layers CUL1 to CUL3.

The third sub-electrode layer MEL-S2 is covered by the fourth to sixth color unit layers CUL4 to CUL6. The barrier layer BL covers the first to sixth color unit layers CUL1 to CUL6. The same contents as those for the barrier layer BL of the embodiments described with reference to FIG. 3 and FIG. 4 may be applied to the barrier layer BL of FIG. 9A and FIG. 9B.

The second sub-electrode layer MEL-S1 and the fourth sub-electrode layer TCL-S2 are disposed between the color filter unit CFP3 and the organic light emitting display panel LP. On the fourth to sixth color unit layers CUL4 to CUL6, the second buffer layer BFL2 is disposed. For example, the second buffer layer BFL2 may be interposed between the barrier layer BL and the fourth sub-electrode layer TCL-S2.

The first and second buffer layers BFL1 and BFL2 may be formed of the same material, and the same contents as those for the buffer layer BL of the embodiments described with reference to FIG. 3 and FIG. 4 may be applied to the first and second buffer layers BFL1 and BFL2 of FIG. 9A and FIG. 9B.

The first sub-electrode layer TCL-S1 and the third sub-electrode layer MEL-S2, which are disposed on the lower surface of the second base substrate BS2, are electrically separated from each other. The light shielding layer BML may be interposed between the first sub-electrode layer TCL-S1 and the third sub-electrode layer MEL-S2.

The second sub-electrode layer MEL-S1 and the fourth sub-electrode layer TCL-S2, which are disposed on the color filter unit CFP3, may be electrically separated from each other.

In FIG. 8, a structure in which the first and third sub-electrode layers TCL-S1 and MEL-S2 are separated from each other, and the second and fourth sub-electrode layers MEL-S and TCL-S2 are separated from each other is illustrated, but the exemplary embodiment of the inventive concept is not limited thereto. For example, the first and third sub-electrode layers TCL-S1 and MEL-S2 may be connected to each other to be formed as one electrode layer, and the second and fourth sub-electrode layers MEL-S1 and TCL-S2 may also be connected to each other to be formed as one electrode layer. When the first and third sub-electrode layers TCL-S1 and MEL-S2 are formed as a first integrated electrode layer, and the second and fourth sub-electrode layers MEL-S1 and TCL-S2 are formed as a second integrated electrode layer, each of the first and second integrated electrode layers may be formed of a transparent conductive material.

Referring to FIG. 8, the light emitting layer EML of the organic light emitting element OEL may be patterned to correspond to each of the first to sixth color unit layers CUL1 to CUL6. A first light emitting layer EML1 may be disposed corresponding to the first light and fourth color unit layers CUL1 and CUL4, and a second light emitting layer EML2 may be disposed corresponding to the second and fifth color unit layers CUL2 and CUL5. A third light emitting layer EML3 may be disposed corresponding to the third and sixth color unit layers CUL3 and CUL6. The first light emitting layer EML1 emits a red light $IL_R$ and the second light emitting layer. EML2 emits a green light $IL_G$. The third light emitting layer EML3 emits a blue light $IL_B$.

The first sub-solar cell unit SCU-S1 converts external light EL (for example, sunlight) into electrical energy, and the second sub-solar cell unit SCU-S2 converts internal light $IL_R$, $IL_G$, and $IL_B$ into electrical energy. When the external light EL is present, the first sub-solar cell unit SCU-S1 is turned on to convert the external light EL into electrical energy. An optical sensor may be configured to sense whether the external light EL is present, and the system may determine whether to turn ON/OFF the first sub-solar cell unit SCU-S1 based on the sensing result.

During the night or in a dark place in which external light EL is weak, the first sub-solar cell unit SCU-S1 is turned off, and electrical energy may be accumulated only by using the second sub-solar cell unit SCU-S2.

Figure 10:
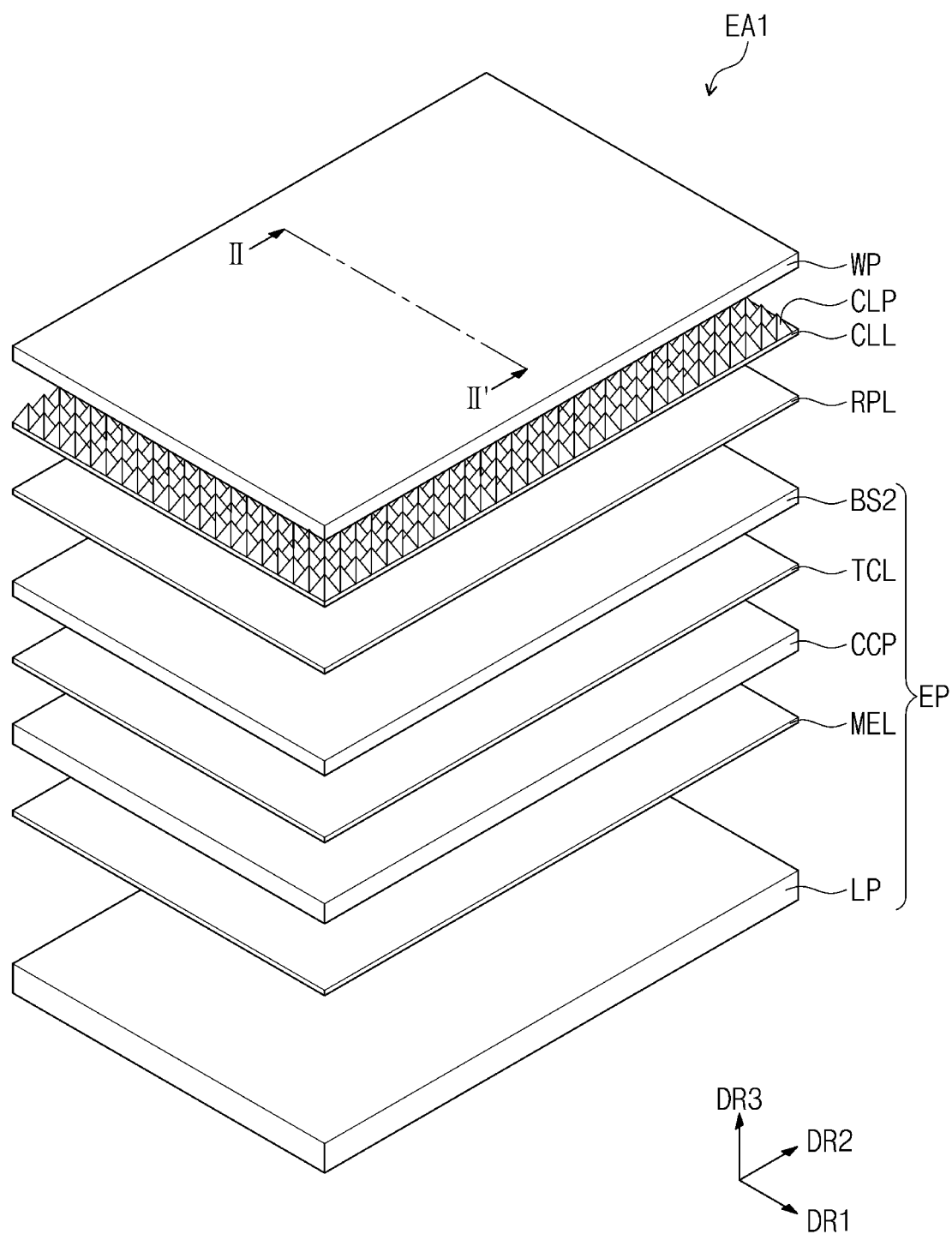
FIG. 10 is a perspective view illustrating an electronic display apparatus according to an exemplary embodiment of the present inventive concept.
Figure 11:
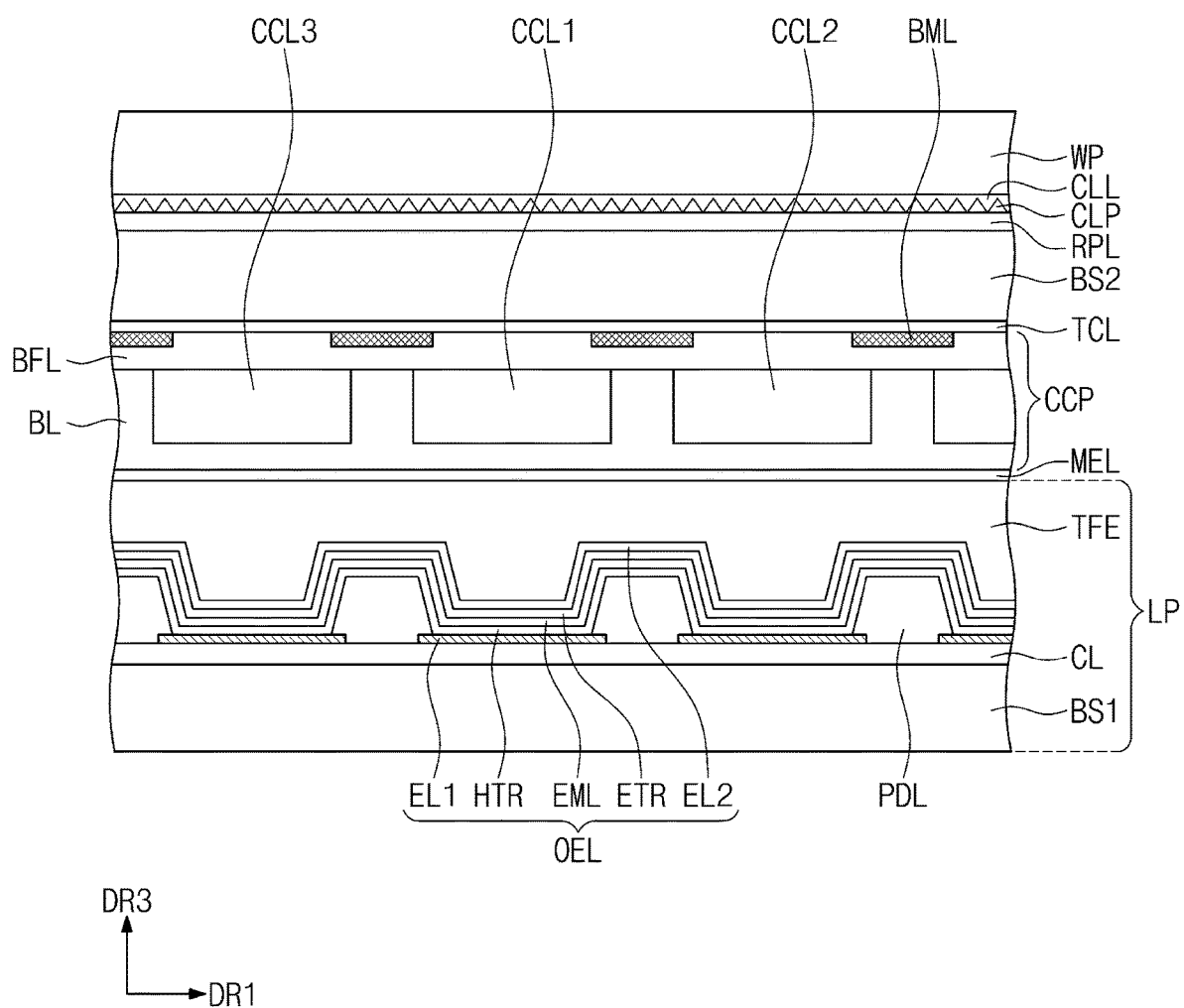
FIG. 11 is a cross-sectional view illustrating a portion corresponding to line II-II' of FIG. 10 according to an exemplary embodiment of the present inventive concept.

FIG. 10 is a perspective view illustrating an electronic display apparatus according to an exemplary embodiment of the present inventive concept, and FIG. 11 is a cross-sectional view illustrating an exemplary embodiment of a portion corresponding to line II-II' of FIG. 10.

Referring to FIG. 10 and FIG. 11, an electronic display apparatus EA1, according to an exemplary embodiment of the present inventive concept, may include the electronic panel EP, a light collecting unit, a reflection prevention unit, and a window unit.

At least some of components of the electronic panel EP, the reflection prevention unit, and the window unit may be formed by a continuous process, or at least some of the components may be combined with each other through an adhesive member.

In FIG. 10 and FIG. 11, among the light collecting unit, the reflection prevention unit, and the window unit, a component formed with other components through a continuous process is represented as a "layer." Among the light collecting unit, the reflection prevention unit, and the window unit, a component combined with other components through an adhesive member is represented as a "panel." The panel includes a base layer which provides a base surface, such as a synthetic resin film, a composite film, a glass substrate, but the "layer" might not include the base layer. For example, the units represented by the "layer" are disposed on the base surface provided by other units.

As illustrated in FIG. 10 and FIG. 11, the electronic display apparatus EA1 may include the electronic panel EP, a light collecting layer CLL, a reflection prevention layer RPL, and a window panel WP. The light collecting layer CLL and the reflection prevention layer RPL may be disposed between the window panel WP and the electronic panel EP.

The light collecting layer CLL may include light collecting patterns CLP which collect external light. As an example of the inventive concept, each of the light collecting patterns CLP may have a rectangular pyramid shape, but the light collecting patterns CLP may alternatively have other shapes.

The reflection prevention layer RPL reduces reflectivity of external light incident from an upper side of the window panel WP. The reflection prevention layer RPL, according to an embodiment of the inventive concept, may include a phase retarder and a polarizer. The retarder may be of a film type or liquid crystal coating type, and may include a V2 phase retarder and/or a 14 phase retarder. The polarizer may also be of a film type or liquid crystal coating type. The film type may include an extensible synthetic resin film, and the liquid crystal coating type may include liquid crystals arranged in a predetermined arrangement. The phase retarder and the polarizer may further include a protective film. The phase retarder and a polarize, or the protective film may be defined as a base layer of the reflection prevention layer RPL.

As illustrated in FIG. 4, in a structure in which the electronic panel EP includes the color filter layer CFL, the reflection prevention layer RPL may be omitted.

The window panel WP may include a glass substrate and/or a synthetic resin film as a base layer. The base layer is not limited to being a single layer. The base layer may include two or more films which are combined with each other by the adhesive member.

The window panel WP may include a light shielding pattern partially formed on the base layer. The light shielding pattern is disposed on a rear surface of the base layer to define a bezel region of the electronic display apparatus EA1.

As illustrated in FIG. 10 and FIG. 11, the laminating order of the light collecting layer CLL and the reflection prevention layer RPL may be changed. For example, the reflection prevention layer RPL may be disposed between the window panel WP and the light collecting layer CLL.

Figure 12:
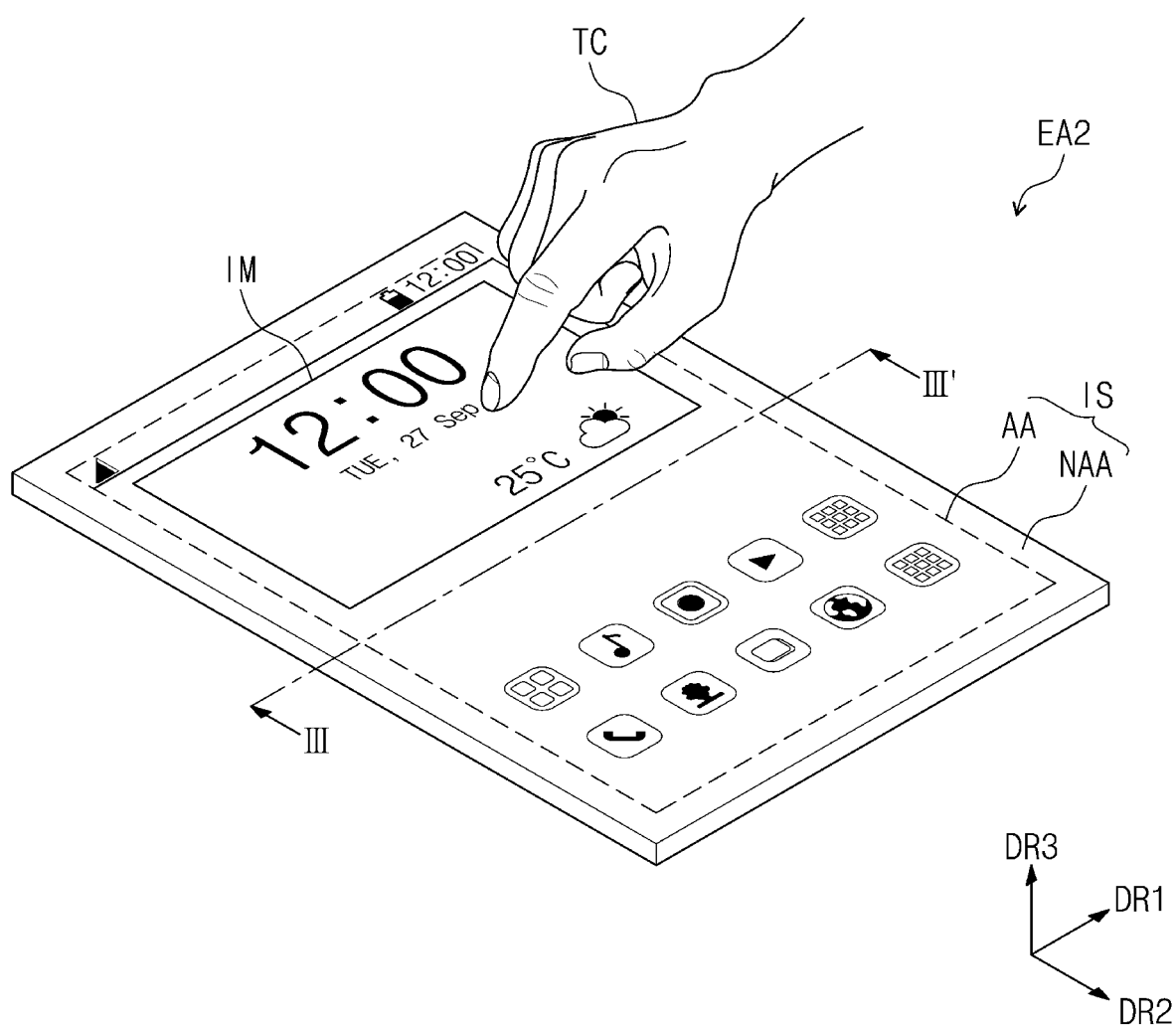
FIG. 12 is a perspective view illustrating an electronic display apparatus according to an exemplary embodiment of the present inventive concept.

FIG. 12 is a perspective view illustrating an electronic display apparatus according to an exemplary embodiment of the present inventive concept.

Referring to FIG. 12, an electronic display apparatus EA2, according to an exemplary embodiment of the present inventive concept, is activated by receiving an electrical signal. According to the electrical signal applied, the electronic display apparatus EA2 activates a display surface IS defined by a plane which first direction DR and the second direction DR2 define. The display surface IS may be divided into an active area AA and a peripheral area NAA on a plane.

The active area AA may be an area which is electrically activated when supplied with an electrical signal. The active area AA may be activated to have various functions according to the use of the electronic display apparatus EA2.

For example, the active area AA may be a sensing area which senses an input applied from the outside. As illustrated in FIG. 12, the electronic display apparatus EA2 may sense an external input TC applied to the active area AA. In this regard, the electronic display apparatus EA may function as an input device.

The external input TC is illustrated as a user's hand, but an input externally applied may be provided in various forms. For example, the input may have various forms such as force, pressure, or light, as well as a touch or being adjacent by a part of a user's body such as the user's hand.

Alternatively, for example, the active area AA may be a display area which displays predetermined information. The electronic display apparatus EA2 displays an image IM on the active area AA, and a user may acquire information through the image IM. In this regard, the electronic display apparatus EA may function as an output device.

The peripheral area NAA is adjacent to the active area AA. The peripheral area NAA does not display an image on the outside or sensing an external input even when an electrical signal is applied.

The peripheral area NAA may be an area in which signal lines for providing the active area AA with a signal applied from the outside or driving elements for driving the active area AA are disposed. The peripheral area NAA may be adjacent to one side of the active area AA.

In the present embodiment, the peripheral area NAA is illustrated to have a frame shape which surrounds the active area AA. However, this is exemplarily illustrated, and in the electronic display apparatus EA2, according to an embodiment of the inventive concept, the peripheral area NAA may be omitted. The peripheral area NAA may be defined to have various shapes.

In FIG. 12, the electronic display apparatus EA2 is exemplarily illustrated as being a touch screen device. However, the electronic display apparatus EA1 may be alternatively configured, and in the electronic display apparatus EA2, a display function may be omitted.

Figure 13:
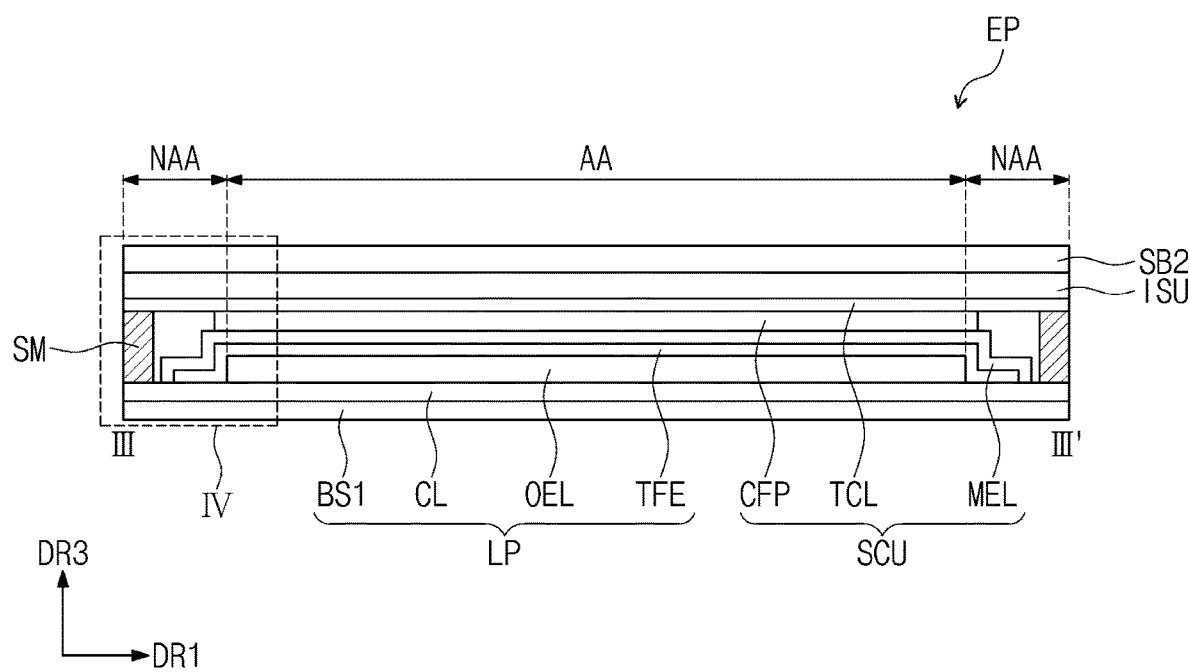
FIG. 13 is a cross-sectional view taken along line III-III' of FIG. 12 according to an exemplary embodiment of the present inventive concept.
Figure 14:
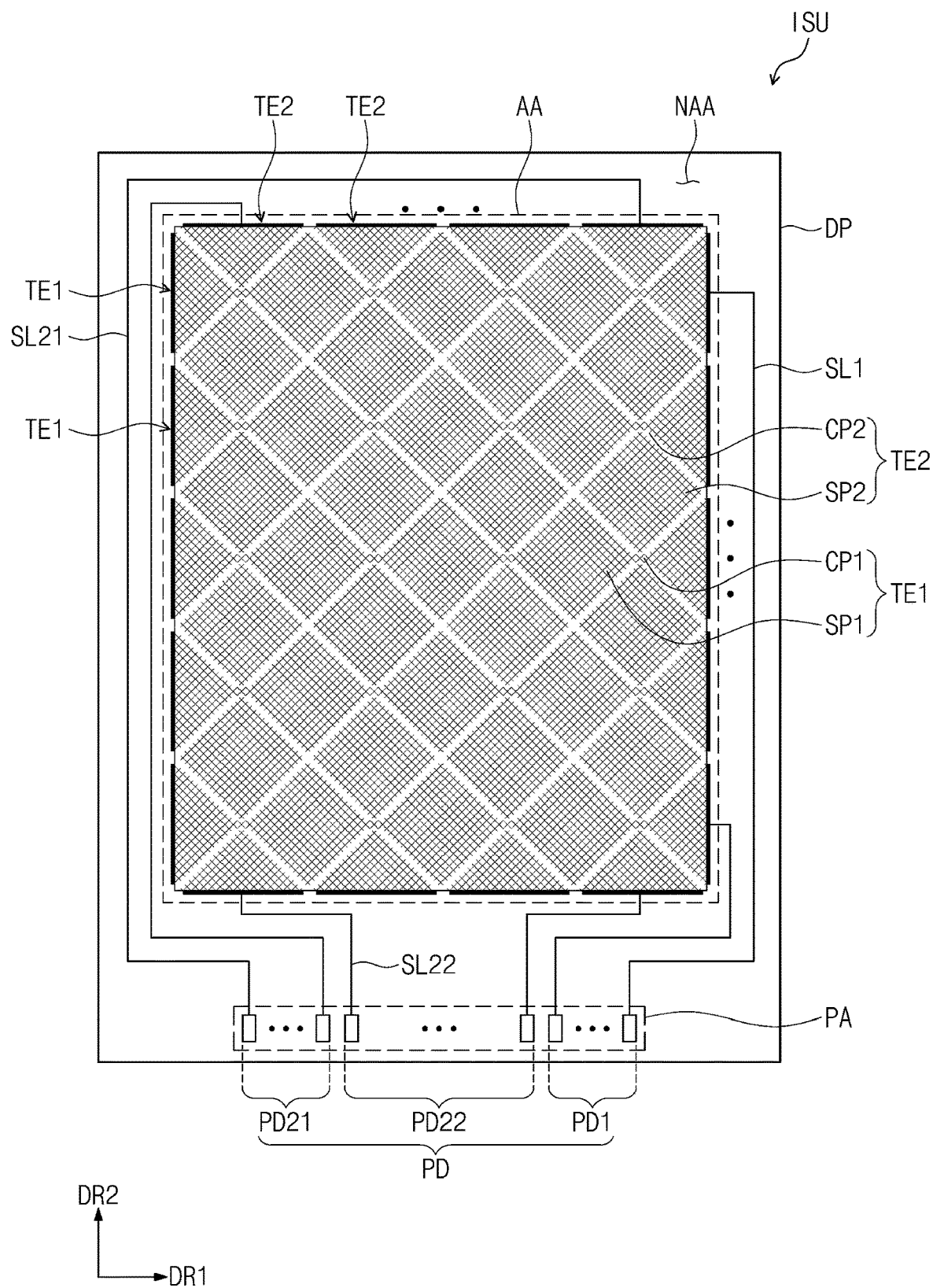
FIG. 14 is a plan view schematically illustrating the input sensing unit illustrated in FIG. 13 according to an exemplary embodiment of the present inventive concept.

FIG. 13 is a cross-sectional view taken along line III-III' illustrated in FIG. 12. FIG. 14 is a plan view schematically illustrating an input sensing unit illustrated in FIG. 13.

Referring to FIG. 13, the electronic panel EP includes the light source unit LP, the second base substrate BS2, the color filter unit CFP, an input sending unit ISU (or a touch sensing unit). An electronic display apparatus, according to an exemplary embodiment of the present inventive concept, may further include a reflection prevention layer and/or a window panel both of which are disposed on the second base substrate BS2.

The light source unit LP may be a light emitting type display panel, but is not particularly limited thereto. For example, the light source unit LP may be an organic light emitting display panel.

The same contents as those for the light source member LP, according to the exemplary embodiments described with reference to FIGS. 2 to 11, may be applied to the light source unit LP of FIG. 13, and therefore, redundant descriptions will be omitted.

The input sensing unit ISU obtains coordinate information of an external input. The input sensing unit ISU is disposed directly on the second base substrate BS2. As used herein, the term "disposed directly" excludes attaching using a separate adhesive layer, and means being formed by a continuous process.

The input sensing unit ISU may have a multi-layered structure. The input sensing unit ISU may have a conductive layer that is made of a single layer or of multiple layers. The input sensing unit ISU may have an insulation layer that is made of a single layer or of multiple layers.

The input sensing unit ISU may sense an external input, for example, by a capacitive method. In the inventive concept, an operation method of the input sensing unit ISU is not particularly limited. In an exemplary embodiment of the present inventive concept, the input sensing unit ISU may sense an external input by an electromagnetic induction method or a pressure sensing method.

In the present embodiment, the input sensing unit ISU is illustrated as being disposed on the lower surface of the second base substrate BS2. However, this is exemplarily illustrated, and the input sensing unit ISU may be disposed on an upper surface of the second base substrate BS2.

The electronic panel EP, according to the present embodiment, may further include the solar cell unit SCU interposed between the input sensing unit ISU and the light source unit LP. The solar cell unit SCU may be defined by the first electrode layer TCL, the color filter unit CFP, and the second electrode layer MEL.

The same contents as those for the solar units according to the embodiments described with reference to FIGS. 2 to 11 may be applied to the solar cell unit SCU of FIG. 13, and therefore, redundant descriptions will be omitted.

The electronic panel EP, according to the present embodiment, further includes a sealing member SM. The sealing member SM is interposed between the light source unit LP and the second base substrate BS2 in order to couple the light source unit LP and the second base substrate BS2. In order to increase coupling force, the sealing member SM may come into direct contact with the first base substrate BS1 of the light source unit LP, and may come into direct contact with the second base substrate BS2. For example, an upper surface of the sealing member SM may partially overlap the input sensing unit ISU, the first electrode layer TCL and the like, or a lower surface of the sealing member SM may partially overlap the circuit element layer CL and the like.

Referring to FIG. 14, the input sensing unit ISU may include a first sensing electrode TE1, a second sensing electrode TE2, a first signal line SL1, second signal lines SL21 and SL22, and a pad PD. Conductive patterns respectively include the first sensing electrode TE1, the second sensing electrode TE2, the first signal line SL1, the second signal lines SL21 and SL22, and the pad PD.

The first sensing electrode TE1 is extended along the first direction DR1. The first sensing electrode TE1 may be provided in plurality and arranged along the second direction DR2. The first sensing electrode TE1 includes a plurality of first sensor patterns SP1, which are arranged along the first direction DR1, and first connection patterns CP1, which are disposed among the first sensor patterns SP1 to connect the adjacent first sensor patterns SP1.

The second sensing electrode TE2 may be insulated from the first sensing electrode TE1. The second sensing electrode TE2 is extended along the second direction DR2. The second sensing electrode TE2 may be provided in plurality and arranged along the first direction DR1. The second sensing electrode TE2 includes a plurality of second sensor patterns SP2, which are arranged along the second direction DR2, and second connection patterns CP2, which are disposed among the second sensor patterns SP2, to connect the adjacent second sensor patterns SP2.

The input sensing unit ISU may sense the external input TC (see FIG. 12) by sensing a change in mutual capacitance between the first sensing electrode TE1 and the second sensing electrode TE2, or may sense the external input TC by sensing a change in self-capacitance of each of the first sensing electrode TE1 and the second sensing electrode TE2. The input sensing unit ISU, according to an exemplary embodiment of the present inventive concept, may sense the external input TC in various manners.

The first signal line SL1 is connected to the first sensing electrode TE1. The first signal line SL1 is disposed in the peripheral area NAA and might not be visible from the outside. The second signal lines SL21 and SL22 are connected to the second sensing electrode TE2. The second signal lines SL21 and SL22 are disposed in the peripheral area NAA and might not be visible from the outside.

In the present embodiment, the second signal lines SL21 and SL22 may include an upper signal line SL21 and a lower signal line SL22. The upper signal line SL21 is connected to an upper side of the second sensing electrode TE2, and the lower signal line SL22 is connected to a lower side of the second sensing electrode TE2. The upper signal line SL21 and the lower signal line SL22 may be respectively connected to plurality of pads PD21 and PD22 which are spaced apart from each other. Accordingly, even if the second sensing electrode TE2 has a relatively long extension length compared with the first sensing electrode TE1, an electrical signal can be uniformly applied to the entire region. Thus, the input sensing unit ISU provides an even touch sensing environment for the entire active area AA, regardless of the shape thereof.

Both ends of the first sensing electrode TE1 may be connected to two signal lines, or signal lines may be connected to one end of each of the first sensing electrode TE1 and the second sensing electrode TE2. The input sensing unit ISU, according to an exemplary embodiment of the present inventive concept, may be operated in various manners.

The pads PD may include a first pad PD1 and second pads PD21 and PD22. As described above, each of the pads PD may be correspondingly connected to the first signal line SL1 or to the second signal lines SL21 and SL22 to be electrically connected to the first sensing electrode TE1 or the second sensing electrode TE2. Electrical signals provided from the outside may be provided to the input sensing unit ISU through the pads PD.

Figure 15:
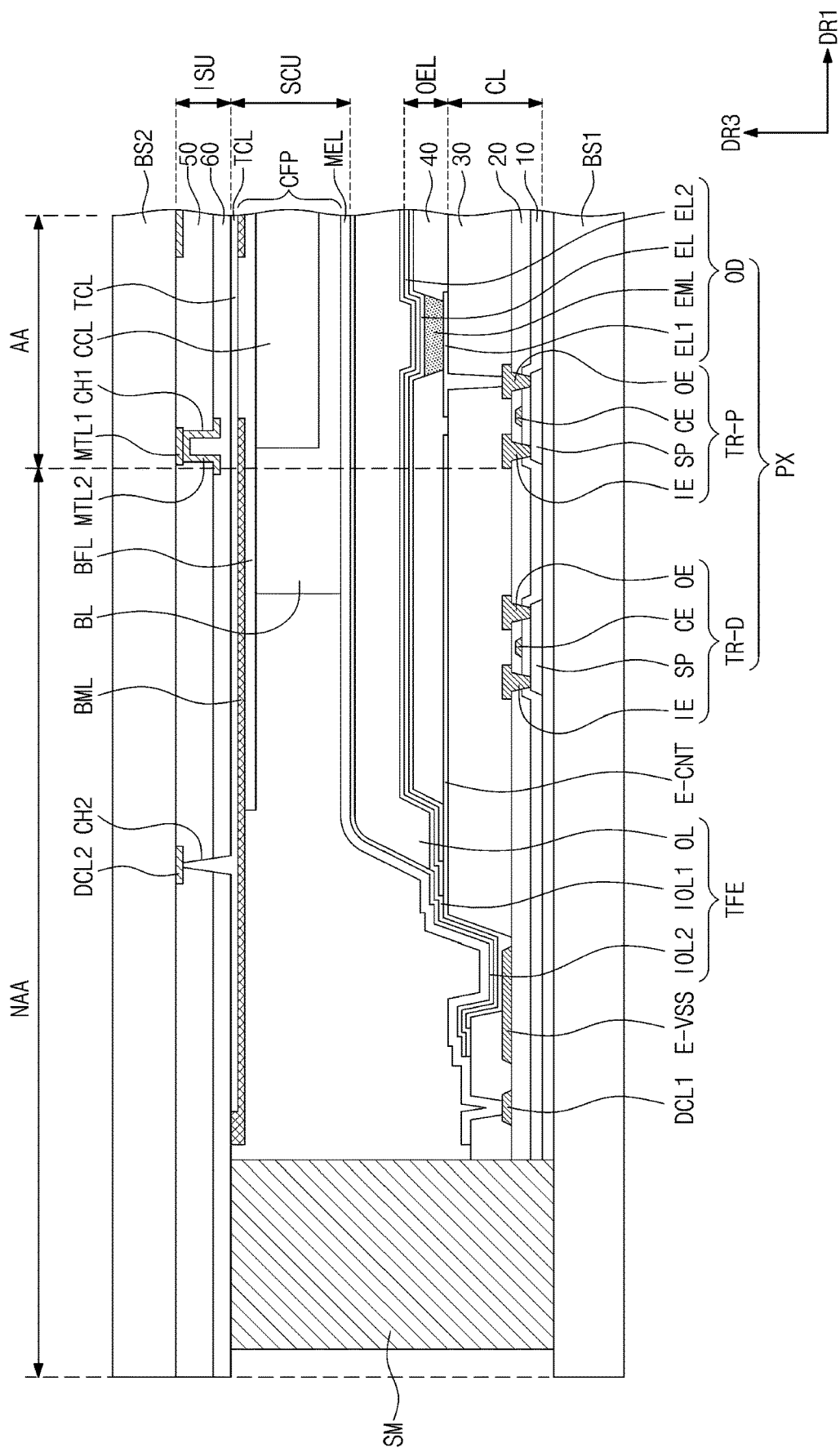
FIG. 15 is a cross-sectional view illustrating portion IV illustrated in FIG. 13 according to an exemplary embodiment of the present inventive concept.
Figure 16:
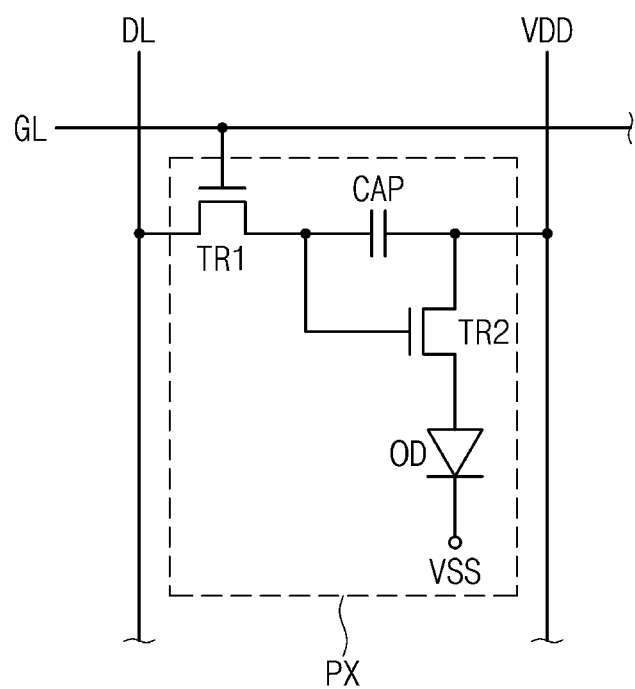
FIG. 16 is an equivalent circuit diagram illustrating the pixel illustrated in FIG. 15 according to an exemplary embodiment of the present inventive concept.

FIG. 15 is a cross-sectional view illustrating IV portion illustrated in FIG. 13, and FIG. 16 is an equivalent circuit diagram of a pixel illustrated in FIG. 15.

Referring to FIG. 15, the electronic panel EP includes the light source unit LP, the second base substrate BS2, the color filter unit CFP, the input sending unit ISU. The circuit element layer CL of the light source unit LP and the display element layer OEL may include components of a pixel PX.

The pixel PX may be disposed in the active area AA. The pixel PX generates light to implement the image IM described above. The pixel PX may be provided in plurality and arranged exclusively in the active area AA.

Referring to FIG. 16, the pixel PX may be connected to a plurality of signal lines. In the present embodiment, a gate line GL, a data line DL, and a power line VDD are exemplarily illustrated among the signal lines. The pixel PX, according to an embodiment of the inventive concept, may be additionally connected to various signal lines.

The pixel PX may include a first thin film transistor TR1, a capacitor CAP, a second thin film transistor TR2, and a light emitting element OD. The first thin film transistor TR1 may be a switching element which turns the pixel PX on/off. The first thin film transistor TR1 may transmit or block a data signal transmitted through the data line DL in response to a gate signal transmitted through the gate line GL.

The capacitor CAP is connected to the first thin film transistor TR1 and the power line VDD. The capacitor CAP charges the amount of charge corresponding to the difference between a data signal transferred from the first thin film transistor TR1 and a first power voltage applied to the power line VDD.

The second thin film transistor TR2 is connected to the first thin film transistor TR1, the capacitor CAP, and the light emitting element OD. The second thin film transistor TR2 controls driving current flowing in the light emitting element OD corresponding to the amount of charge stored in the capacitor CAP. According to the amount of charge charged in the capacitor CAP, the turn-on time of the second thin film transistor TR2 may be determined. The second thin film transistor TR2 provides the light emitting element OD with the first power voltage which is transmitted through the power line VDD during the turn-on time.

The light emitting element OD is connected to the second thin film transistor TR2 and a power terminal VSS. The light emitting device OD emits light using a voltage corresponding to the difference between a signal transmitted through the second thin film transistor TR2 and a second power voltage received through the power terminal VSS. The light emitting element OD may emit light during the turn-on time of the second thin film transistor TR2.

The light emitting element OD includes a light emitting material. The light emitting element OD may generate light of a color corresponding to the light emitting material. The color of light generated in the light emitting element OD may be any one of red, green, blue, and white.

In FIG. 15, a pixel transistor TR-P, a driving transistor TR-D, and the light emitting element OD among the components of the pixel PX are exemplarily illustrated. The pixel transistor TR-P may correspond to the second thin film transistor TR2 illustrated in FIG. 16, and the driving transistor TR-D may correspond to the first thin film transistor TR1 illustrated in FIG. 16. In FIG. 15, a structure in which the display element layer OEL includes one light emitting element OD is illustrated. However, the display element layer OEL may include a plurality of light emitting elements OD.

The pixel transistor TR-P may constitute the circuit element layer CL together with first to third insulation layers 10, 20 and 30 among the plurality of insulation layers. Each of the first to third insulation layers 10, 20, and 30 may include an organic material and/or an inorganic material, and may have a single layer structure or a laminated-layer structure. The circuit element layer CL is disposed on the first base substrate BS1.

The pixel transistor TR-P includes a semiconductor pattern SP, a control electrode CE, an input electrode IE, and an output electrode OE. The semiconductor pattern SP is disposed on the first base substrate BS1. The semiconductor pattern SP may include a semiconductor material. The control electrode CE is spaced apart from the semiconductor pattern SP having the first insulation layer 10 interposed therebetween. The control electrode CE may be connected to one electrode of the first thin film transistor TR1 and to the capacitor CAP.

The input electrode IE and the output electrode OE are spaced apart from the control electrode CE having the second insulation layer 20 interposed therebetween. The input electrode IE and the output electrode OE of the pixel transistor TR-P pass through the first insulation layer 10 and the second insulation layer 20 to be respectively connected to one side and the other side of the semiconductor pattern SP.

The third insulation layer 30 is disposed on the second insulation layer 20 to cover the input electrode IE and the output electrode OE. In the pixel transistor TR-P, the semiconductor pattern SP may be disposed on the control electrode CE. Alternatively, the semiconductor pattern SP may be disposed on the input electrode IE and the output electrode OE. Alternatively, the input electrode IE and the output electrode OE may be disposed on the same layer as the semiconductor pattern SP to be directly connected to the semiconductor pattern SP. The pixel transistor TR-P, according to an exemplary embodiment of the present inventive concept, may have various structures.

The light emitting element OD is disposed on the circuit element layer CL. The light emitting element OD may constitute the display element layer OEL together with a fourth insulation layer 40 among the plurality of insulation layers. The light emitting element OD includes the first electrode EL1, the light emitting layer EML, a control layer EL, and the second electrode EL2. The fourth insulation layer 40 may include an organic material and/or an inorganic material, and may have a single layer structure, or a laminated-layer structure.

The first electrode EL1 may pass through the third insulation layer 30 to be connected to the pixel transistor TR-P. The electronic panel EP may further include a separate connection electrode disposed between the first electrode EL1 and the pixel transistor TR-P, and at this time, the first electrode EL1 may be electrically connected to the pixel transistor TR-P through the connection electrode.

The fourth insulation layer 40 is disposed on the third insulation layer 30. On the fourth insulation layer 40, an opening may be defined. The opening exposes at least a portion of the first electrode EL1. The fourth insulation layer 40 may be a pixel defining layer PDL (see FIG. 2).

The light emitting layer EML is disposed in the opening, and is disposed on the first electrode EL1, which is exposed by the opening. The light emitting layer EML may include a light emitting material. For example, the light emitting layer EML may be composed of at least one material among materials which emit red, green, and blue light, and may include a fluorescent material or a phosphorescent material. The light emitting layer EML may include an organic light emitting material or an inorganic light emitting material. The light emitting layer EML may emit light in response to a potential difference between the first electrode EL1 and the second electrode EL2.

The control layer EL is disposed between the first electrode EL1 and the second electrode EL2. The control layer EL is adjacent to the light emitting layer EML. The control layer EL controls the movement of charges to increase light emitting efficiency and the lifespan of the light emitting element OD. The control layer EL may include at least any one of a hole transport material, a hole injection material, an electron transport material, or an electron injection material.

In the present embodiment, the control layer EL is illustrated to be disposed between the light emitting layer EML and the second electrode EL2. The control layer EL may be disposed between the light emitting layer EML and the first electrode EL1, and may be provided as a plurality of layers laminated along the third direction DR3 having the light emitting layer EML interposed therebetween The control layer EL may have an integrated shape extending from the active area AA to the peripheral area NAA. The control layer EL may be commonly provided to a plurality of pixels.

The second electrode EL2 is disposed on the light emitting layer EML. The second electrode EL2 may face the first electrode EL1. The second electrode EL2 may have an integrated shape extending from the active area AA to the peripheral area NAA. The second electrode EL2 may be commonly provided to a plurality of pixels. Each of the light emitting elements OD respectively disposed in each of the pixels receives a common power voltage (hereinafter, the second power voltage) through the second electrode EL2.

The second electrode EL2 may include a transmissive conductive material or a transreflective conductive material. Accordingly, light generated in the light emitting layer EML may be emitted toward the third direction DR3 through the second electrode EL2. The light emitting element OD, according to an exemplary embodiment of the present inventive concept, may be driven, according to the design thereof, by a rear surface light emitting method in which the first electrode EL1 includes a transmissive or transreflective material, or by a double-sided light emitting method in which light is emitted toward both front and rear surfaces.

The encapsulation layer TFE is disposed on the light emitting element OD to encapsulate the light emitting element OD. The encapsulation layer TFE may have an integrated shape extending from the active area AA to the peripheral area NAA. The encapsulation layer TFE may be commonly provided to the plurality of pixels. A capping layer which covers the second electrode EL2 may further be disposed between the second electrode EL2 and the encapsulation layer TFE.

The encapsulation layer TFE may include a first inorganic layer IOL1, an organic layer OL, and a second inorganic layer IOL2, all of which are sequentially laminated along the third direction DR3. However, the inventive concept is not limited thereto, and the encapsulation layer TFE may further include a plurality of inorganic layers and organic layers.

The first inorganic layer IOL1 may cover the second electrode EL2. The first inorganic layer IOL1 may prevent external moisture or oxygen from penetrating into the light emitting element OD. For example, the first inorganic layer IOL1 may include silicon nitride, silicon oxide, or a compound thereof. The first inorganic layer IOL1 may be formed through a deposition process.

The organic layer OL may be disposed on the first inorganic layer IOL1 and may come into contact with the first inorganic layer IOL1. The organic layer OL may provide a flat surface on the first inorganic layer IOL1. Bumps formed on an upper surface of the first inorganic layer IOL1, or particles present on the first inorganic layer IOL1 are covered by the organic layer OL so that the surface state of the upper surface of the first inorganic layer IOL1 may be prevented from affecting components formed on the organic layer OL. In addition, the organic layer OL may relieve stress between contacting layers. The organic layer OL may include an organic material, and may be formed though a solution process such as spin coating, slit coating, and ink jet processes.

The second inorganic layer IOL2 is disposed on the organic layer OL to cover the organic layer OL. The second inorganic layer IOL2 may be stably formed on a relatively flat surface than being disposed on the first inorganic layer IOL1. The second inorganic layer IOL2 encapsulates moisture and the like discharged from the organic layer OL to prevent the moisture from entering the outside. The second inorganic layer IOL2 may include silicon nitride, silicon oxide, or a compound thereof. The second inorganic layer IOL2 may be formed through a deposition process The second electrode layer MEL of the solar cell unit SCU may be disposed above the encapsulation layer TFE.

The driving transistor TR-D is exemplarily illustrated to have a structure which corresponds to that of the pixel transistor TR-P. For example, the driving transistor TR-D may include the semiconductor pattern SP disposed on the first base substrate BS1, the control electrode CE disposed on the first insulation layer 10, and the input electrode IE and the output electrode OE disposed on the second insulation layer 20. Accordingly, the pixel transistor TR-P and the driving transistor TR-D may be simultaneously formed in the same process so that the process may be simplified and the process cost may be reduced. The driving transistor TR-D, according to an exemplary embodiment of the inventive concept, may have a structure different from that of the pixel transistor TR-P.

Signal patterns E-VSS, E-CNT, and DCL1 may include a power supply line E-VSS, a connection electrode E-CNT, and a first driving signal line DCL1. The power supply line E-VSS may correspond to the power terminal VSS of the pixel PX. Accordingly, the power supply line E-VSS supplies the second power voltage to the light emitting element OD. In the present embodiment, the second power voltages supplied to the pixels PX may be a common voltage for all the pixels PX.

The power supply line E-VSS is disposed on the second insulation layer 20 and constitutes the circuit element layer CL. The power supply line E-VSS and the input electrode IE or the output electrode OE of the driving transistor TR-D may be simultaneously formed in the same process. The power supply line E-VSS may be disposed on a different layer from the layer on which the input electrode IE or the output electrode OE of the driving transistor TR-D is disposed, and may be formed through a separate process.

The connection electrode E-CNT is disposed on the third insulation layer 30 and constitutes the display element layer OEL. The connection electrode E-CNT is electrically connected to the power supply line E-VSS. The connection electrode E-CNT is extended from the third insulation layer 30 to cover an upper surface of the power supply line E-VSS exposed from the third insulation layer 30.

The second electrode EL2 of the light emitting element OD is extended from the active area AA and is connected to the connection electrode E-CNT. The connection electrode E-CNT may receive the second power voltage from the power supply line E-VSS. Accordingly, the second power voltage is transmitted through the connection electrode E-CNT to the second electrode EL2, and may be provided to each of the pixels.

The connection electrode E-CNT may be disposed on the same layer as the layer on which the first electrode EL1 of the light emitting element OD is disposed, and may be simultaneously formed with the first electrode EL1. However, the connection electrode E-CNT may be disposed on a different layer from the layer the first electrode EL1 is disposed.

The first driving signal line DCL1 may be electrically connected to the second electrode layer MEL of the solar cell unit SCU. The first driving signal line DCL1 may provide the second electrode layer MEL with a first driving signal for driving the solar cell unit SCU.

The second base substrate BS2 is disposed facing the first base substrate BS1, and the input sensing unit ISU and the solar cell unit SCU may be disposed on the second base substrate BS2.

The input sensing unit ISU may include a first conductive layer MTL1 and a second conductive layer MTL2. The first conductive layer MTL1 may be disposed on the lower surface of the second base substrate BS2.

The first conductive layer MTL1 may include a conductive material. For example, the first conductive layer MTL1 may include a metal, a transparent conductive oxide, and/or a conductive polymer.

The first conductive layer MTL1 is covered by a fifth insulation layer 50, and the second conductive layer MTL2 is disposed on the fifth insulation layer 50. The second conductive layer MTL2 may include a conductive material. For example, the second conductive layer MTL2 may include a metal, a transparent conductive oxide, and/or a conductive polymer.

The second conductive layer MTL2 may be electrically connected to a portion of the first conductive layer MTL1 through a first contact hole CH1 which passes through the fifth insulation layer 50.

The input sensing unit ISU may sense an external input through a change in capacitance formed between the first conductive layer MTL1 and the second conductive layer MTL2.

The solar cell unit SCU is interposed between the input sensing unit ISU and the encapsulation layer TFE. As for the structure of the solar cell unit SCU, the same contents as those for the solar cell units according to the embodiments described with reference to FIGS. 2 to 11 may be applied thereto, and therefore, redundant descriptions will be omitted.

The input sensing unit ISU may further include a sixth insulation layer 60 for electrically insulating the second conductive layer MTL2 from the solar cell unit SCU.

The first electrode layer TCL of the solar cell unit SCU may be disposed above the sixth insulation layer 60.

The input sensing unit ISU may further include a second driving signal line DCL2. The second driving signal line DCL2 may be electrically connected to the first electrode layer TCL. The second driving signal line DCL2 may provide the first electrode layer TCL with a second driving signal for driving the solar cell unit SCU. The first electrode layer TCL may be connected to the second driving signal line DCL2 through a second contact hole CH2 which is formed through the fifth and sixth insulation layers 50 and 60.

In FIG. 15, as an example of the inventive concept, a structure in which the first driving signal like DCL1 is disposed on the side of the first base substrate BS1 is illustrated, but the inventive concept is not limited thereto. The first driving signal like DCL1 for providing the first driving signal to the solar cell unit SCU may be disposed together with the second driving signal line DCL2 on the side of the second base substrate BS2.

According to the inventive concept, two electrode layers are respectively disposed on upper and lower sides of a color filter unit which receives light output from a light source unit and includes color quantum dots. Accordingly, a solar cell unit defined by the two electrode layers and the color filter unit may be disposed on the light source unit. The solar cell unit accumulates electrical energy by causing photoelectric conversion using external light or internal light from the light source unit. The accumulated electrical energy may be used as power required to drive an electronic display apparatus.

The above-disclosed subject matter is to be considered illustrative and not restrictive, and the appended claims are intended to cover all such modifications, enhancements, and other embodiments, which fall within the true spirit and scope of the inventive concept.

What is claimed is:

1. An electronic display apparatus, comprising:
   a substrate;
   a light source unit disposed on the substrate, the light source unit configured to provide a first light;
   a solar cell unit disposed on the light source unit; and
   an input sensing unit disposed on the solar cell unit and configured to sense input from an outside source,
   wherein the solar cell unit comprises:
     a color filter unit disposed on the light source unit and configured to receive the first light, the color filter unit including a quantum dot;
     a first electrode layer disposed over a top surface of the color filter unit, relative to the substrate; and
     a second electrode layer disposed under a bottom surface of the color filter unit, relative to the substrate,
   wherein the color filter unit is disposed between the first electrode layer and the second electrode layer.

2. The electronic display apparatus of claim 1, wherein the light source unit comprises an organic light emitting element.

3. The electronic display apparatus of claim 2, wherein the color filter unit comprises:

a first converter configured to convert the first light into a second light having a different wavelength from the first light; and a second converter configured to convert the first light into a third light having a different wavelength from the first light and the third light.

4. The electronic display apparatus of claim 3, wherein the quantum dot comprises a first color quantum dot disposed within the first converter, and a second color quantum dot disposed within the second converter.

5. The electronic display apparatus of claim 3, wherein the first light is a blue light, the second light is a green light, and the third light is a red light.

6. The electronic display apparatus of claim 3, wherein the color filter unit comprises:
   a first color conversion layer that includes the first converter;
   a second color conversion layer that includes the second converter; and
   a third color conversion layer configured to transmit the first light.

7. The electronic display apparatus of claim 1, further comprising an encapsulation layer disposed between the light source unit and the solar cell unit.

8. The electronic display apparatus of claim 7, the second electrode layer is directly disposed on the encapsulation layer.

9. An electronic display apparatus, comprising:
   a substrate;
   a light source unit disposed on the substrate and configured to provide a first light, the light source unit comprising a first electrode, a light emitting layer and a second electrode;
   a color filter unit disposed on the light source unit and configured to receive the first light, the color filter unit including a quantum dot;
   a first electrode layer disposed over a top surface of the color filter unit, relative to the substrate; and
   a solar cell unit disposed on the light emitting layer, the solar cell unit comprising the first electrode layer, the color filter unit, and the second electrode,
   wherein the color filter unit is disposed between the first electrode layer and the second electrode.

10. The electronic display apparatus of claim 9, wherein the color filter unit comprises:
    a first converter configured to convert the first light into a second light having a different wavelength from the first light; and
    a second converter configured to convert the first light into a third light having a different wavelength from the first light and the third light.

11. The electronic display apparatus of claim 10, wherein the quantum dot comprises a first color quantum dot disposed within the first converter, and a second color quantum dot disposed within the second converter.

12. The electronic display apparatus of claim 10, wherein the first light is a blue light, the second light is a green light, and the third light is a red light.

13. The electronic display apparatus of claim 10, wherein the color filter unit comprises:
    a first color conversion layer that includes the first converter;
    a second color conversion layer that includes the second converter; and
    a third color conversion layer configured to transmit the first light.

14. The electronic display apparatus of claim 9, further comprising an encapsulation layer disposed between the second electrode and the color filter unit.

15. An electronic display apparatus, comprising:
    a display panel including a first base substrate, a circuit element layer having a pixel driving circuit, and a display element layer disposed on the circuit element layer and including light emitting elements configured to provide light;
    a second base substrate facing the first base substrate;
    a color filter unit disposed between the second base substrate and the display panel and configured to receive the provided light and including a quantum dot;
    a first electrode layer disposed on a first side of the color filter unit;
    a second electrode layer disposed on a second side of the color filter unit; and
    an input sensing unit disposed on the second base substrate and configured to sense input from an outside source,
    wherein a solar cell unit is defined by the first electrode layer, the color filter unit, and the second electrode layer and the solar cell unit is disposed on the display panel.

16. The electronic display apparatus of claim 15, wherein the first electrode layer comprises a transparent conductive material.

17. The electronic display apparatus of claim 15, wherein the second electrode layer comprises a metal material, or a transparent conductive material.

18. The electronic display apparatus of claim 15, wherein the light source unit comprises an organic light emitting element, and wherein the second electrode layer is one electrode of the organic light emitting element.

19. The electronic display apparatus of claim 15, wherein the solar cell unit comprises:
    a first sub-solar cell unit configured to produce photoelectric conversion using an external light; and
    a second sub-solar cell unit configured to produce photoelectric conversion using the first light which is provided from the light source unit.

20. The electronic display apparatus of claim 15 further comprising a window panel covering the input sensing unit.

* * * * *